US009666272B2

(12) United States Patent
Viviani

(10) Patent No.: US 9,666,272 B2
(45) Date of Patent: May 30, 2017

(54) RESISTIVE CHANGE ELEMENT ARRAYS USING RESISTIVE REFERENCE ELEMENTS

(71) Applicant: Nantero Inc., Woburn, MA (US)

(72) Inventor: Darlene Viviani, White Salmon, WA (US)

(73) Assignee: Nantero Inc., Woburn, MA (US)

( * ) Notice: Subject to any disclaimer, the term of this patent is extended or adjusted under 35 U.S.C. 154(b) by 0 days.

(21) Appl. No.: 14/994,077

(22) Filed: Jan. 12, 2016

(65) Prior Publication Data

US 2016/0125941 A1 May 5, 2016

Related U.S. Application Data

(63) Continuation of application No. 14/457,520, filed on Aug. 12, 2014, now Pat. No. 9,263,126.

(51) Int. Cl.
*G11C 11/00* (2006.01)
*G11C 13/00* (2006.01)
*G11C 13/02* (2006.01)

(52) U.S. Cl.
CPC ........ *G11C 13/0021* (2013.01); *G11C 13/004* (2013.01); *G11C 13/0004* (2013.01);
(Continued)

(58) Field of Classification Search
CPC .............. G11C 2213/79; G11C 13/004; G11C 2013/0054; G11C 13/0007; G11C 11/16; G11C 13/0004; G11C 11/14; G11C 11/15; G11C 13/0069; G11C 11/1673; G11C 13/0038; G11C 13/0064; G11C 2013/0045

USPC .... 365/148, 158, 163, 171, 189.011, 230.03, 365/145, 189.16, 200, 210.1, 225.7, 48, 365/51, 63, 66, 72
See application file for complete search history.

(56) References Cited

U.S. PATENT DOCUMENTS 4,293,587 A 10/1981 Trueblood
4,979,149 A 12/1990 Popovic et al.
(Continued)

FOREIGN PATENT DOCUMENTS

EP 0036802 9/1981
JP 57113296 7/1982
(Continued)

OTHER PUBLICATIONS

Ago, et al., "Electronic Interaction Between Photoexcited Poly (P-phenylene vinylene) and Carbon Nanotubes," Phys. Rev. B, Jan. 2000, vol. 61, No. 3, pp. 2286-2290.
(Continued)

*Primary Examiner* — Thong Q Le
(74) *Attorney, Agent, or Firm* — Nantero Inc.

(57) ABSTRACT

Methods for dynamically programming and dynamically reading one or more resistive change elements within a resistive change element array are disclosed. These methods include first pre-charging all of the array lines within a resistive change element array simultaneously and then grounding certain array lines while allowing other array lines to float in order to direct discharge currents through only selected cells. In this way, resistive change elements within resistive change element arrays made up of 1-R cells—that is, cells without in situ selection circuitry—can be reliably and rapidly accessed and programmed.

17 Claims, 14 Drawing Sheets

(52) U.S. Cl.
CPC ...... *G11C 13/0007* (2013.01); *G11C 13/0026* (2013.01); *G11C 13/0028* (2013.01); *G11C 13/0061* (2013.01); *G11C 13/0069* (2013.01); *G11C 13/025* (2013.01); *G11C 2013/0078* (2013.01); *G11C 2213/71* (2013.01); *G11C 2213/72* (2013.01); *G11C 2213/77* (2013.01); *G11C 2213/79* (2013.01); *G11C 2213/82* (2013.01)

(56) References Cited

U.S. PATENT DOCUMENTS

| | | |
|---|---|---|
| 5,311,039 A | 5/1994 | Kimura et al. |
| 6,422,450 B1 | 7/2002 | Zhou et al. |
| 6,423,583 B1 | 7/2002 | Avouris et al. |
| 6,445,006 B1 | 9/2002 | Brandes et al. |
| 6,528,020 B1 | 3/2003 | Dai et al. |
| 6,574,130 B2 | 6/2003 | Segal et al. |
| 6,643,165 B2 | 11/2003 | Segal et al. |
| 6,686,646 B2 | 2/2004 | Lee |
| 6,706,402 B2 | 3/2004 | Rueckes et al. |
| 6,795,338 B2 | 9/2004 | Parkinson et al. |
| 6,800,928 B1 | 10/2004 | Lee et al. |
| 6,808,746 B1 | 10/2004 | Dai et al. |
| 6,835,591 B2 | 12/2004 | Rueckes et al. |
| 6,888,773 B2 | 5/2005 | Morimoto et al. |
| 6,889,216 B2 | 5/2005 | Nugent |
| 6,890,780 B2 | 5/2005 | Lee et al. |
| 6,894,359 B2 | 5/2005 | Bradley et al. |
| 6,899,945 B2 | 5/2005 | Smalley et al. |
| 6,905,892 B2 | 6/2005 | Esmark et al. |
| 6,918,284 B2 | 7/2005 | Snow et al. |
| 6,919,592 B2 | 7/2005 | Segal et al. |
| 6,919,740 B2 | 7/2005 | Snider et al. |
| 6,921,575 B2 | 7/2005 | Horiuchi et al. |
| 6,924,538 B2 | 8/2005 | Jaiprakash et al. |
| 6,955,937 B1 | 10/2005 | Burke et al. |
| 6,969,651 B1 | 11/2005 | Lu et al. |
| 6,990,009 B2 | 1/2006 | Bertin et al. |
| 6,995,649 B2 | 2/2006 | Nugent |
| 7,015,500 B2 | 3/2006 | Choi et al. |
| 7,095,645 B2 | 8/2006 | Pinkerton et al. |
| 7,115,901 B2 | 10/2006 | Bertin et al. |
| 7,161,403 B2 | 1/2007 | Bertin et al. |
| 7,335,395 B2 | 2/2008 | Ward et al. |
| 7,336,523 B2 | 2/2008 | Kang |
| 7,365,632 B2 | 4/2008 | Bertin et al. |
| 7,366,009 B2 | 4/2008 | Katti |
| 7,394,687 B2 | 7/2008 | Bertin et al. |
| 7,443,712 B2 | 10/2008 | Bill |
| 7,479,654 B2 | 1/2009 | Bertin et al. |
| 7,566,478 B2 | 7/2009 | Ward et al. |
| 7,667,999 B2 | 2/2010 | Herner |
| 7,781,862 B2 | 8/2010 | Bertin et al. |
| 7,782,650 B2 | 8/2010 | Bertin et al. |
| 7,826,248 B2 | 11/2010 | Xi et al. |
| 7,830,705 B2 | 11/2010 | Jeong |
| 7,835,170 B2 | 11/2010 | Bertin et al. |
| 7,902,537 B2 | 3/2011 | Schricker et al. |
| 7,948,054 B2 | 5/2011 | Bertin et al. |
| 7,982,209 B2 | 7/2011 | Herner |
| 7,986,546 B2 | 7/2011 | Bertin et al. |
| 8,000,127 B2 | 8/2011 | Hamilton |
| 8,008,745 B2 | 8/2011 | Bertin et al. |
| 8,013,363 B2 | 9/2011 | Bertin et al. |
| 8,030,637 B2 | 10/2011 | Ufert |
| 8,058,089 B2 | 11/2011 | Segal et al. |
| 8,102,018 B2 | 1/2012 | Bertin et al. |
| 8,179,711 B2 | 5/2012 | Kim |
| 8,183,665 B2 | 5/2012 | Bertin et al. |
| 8,217,490 B2 | 7/2012 | Bertin et al. |
| 8,299,450 B2 | 10/2012 | Ahn et al. |
| 8,331,130 B2 | 12/2012 | Yasuda |
| 8,351,239 B2 | 1/2013 | Kim |
| 8,619,450 B2 | 12/2013 | Hamilton |
| 8,766,227 B1 | 7/2014 | Shepard |
| 9,070,878 B2 | 6/2015 | Shepard |
| 9,263,126 B1 | 2/2016 | Viviani |
| 9,299,430 B1 | 3/2016 | Bertin et al. |
| 2003/0170930 A1 | 9/2003 | Choi et al. |
| 2003/0183504 A1 | 10/2003 | Ajayan et al. |
| 2003/0199172 A1 | 10/2003 | Rueckes et al. |
| 2004/0031975 A1 | 2/2004 | Kern |
| 2004/0041154 A1 | 3/2004 | Watanabe et al. |
| 2004/0132070 A1 | 7/2004 | Star et al. |
| 2004/0175856 A1 | 9/2004 | Jaiprakash et al. |
| 2004/0181630 A1 | 9/2004 | Jaiprakash et al. |
| 2004/0266106 A1 | 12/2004 | Lee et al. |
| 2005/0030810 A1 | 2/2005 | Shepard |
| 2005/0035367 A1 | 2/2005 | Bertin et al. |
| 2005/0056877 A1 | 3/2005 | Rueckes et al. |
| 2005/0179052 A1 | 8/2005 | Yi et al. |
| 2005/0212014 A1 | 9/2005 | Horibe et al. |
| 2006/0034116 A1 | 2/2006 | Lam et al. |
| 2006/0215439 A1 | 9/2006 | Bill et al. |
| 2006/0250843 A1 | 11/2006 | Bertin et al. |
| 2006/0250856 A1 | 11/2006 | Bertin et al. |
| 2006/0258122 A1 | 11/2006 | Whitefield et al. |
| 2006/0264053 A1 | 11/2006 | Yates et al. |
| 2006/0281256 A1 | 12/2006 | Carter et al. |
| 2006/0281287 A1 | 12/2006 | Yates et al. |
| 2006/0289996 A1 | 12/2006 | Ono et al. |
| 2006/0292716 A1 | 12/2006 | Gu et al. |
| 2007/0001220 A1 | 1/2007 | Tombler et al. |
| 2007/0078215 A1 | 4/2007 | Yoon et al. |
| 2008/0020487 A1 | 1/2008 | McLean et al. |
| 2008/0070162 A1 | 3/2008 | Ufert |
| 2008/0157126 A1 | 7/2008 | Bertin et al. |
| 2008/0157127 A1 | 7/2008 | Bertin et al. |
| 2008/0170429 A1 | 7/2008 | Bertin et al. |
| 2008/0237599 A1 | 10/2008 | Herner et al. |
| 2008/0239790 A1 | 10/2008 | Herner et al. |
| 2009/0166609 A1 | 7/2009 | Schricker et al. |
| 2009/0166610 A1 | 7/2009 | Schricker et al. |
| 2009/0168491 A1 | 7/2009 | Schricker et al. |
| 2009/0285030 A1 | 11/2009 | Kang et al. |
| 2010/0073992 A1* | 3/2010 | Ueda .............. G11C 11/16 365/148 |
| 2010/0142256 A1 | 6/2010 | Kumar et al. |
| 2010/0328996 A1 | 12/2010 | Shih et al. |

FOREIGN PATENT DOCUMENTS

| | | |
|---|---|---|
| JP | 2002-536782 | 10/2002 |
| JP | 2002-540605 | 11/2002 |
| JP | 2004-090208 | 3/2004 |
| JP | 2005-502201 | 1/2005 |
| JP | 2005-514784 | 5/2005 |
| JP | 2006-514440 | 4/2006 |
| WO | WO-2006/027887 | 3/2006 |
| WO | WO-2006/122111 | 11/2006 |

OTHER PUBLICATIONS

Amblard, G., "Development and characterization of carbon nanotube processes for NRAM technology," Proc. of SPIE 2011, vol. 7970, pp. 797017-1-797017-7.

Awano, Y., "Graphene for VLSI: FET and Interconnect Applications," IEDM 2009 Technical Digest, pp. 10.1.1-10.1.4.

Avouris, P., "Carbon Nanotube Electronics," Chemical Physics, 2002, vol. 281, pp. 429-445.

Batchold et al., "Logic Circuits Based on Carbon Nanotubes," Physica, 2003, pp. 42-46.

Brock, et al., "Carbon Nanotube Memories and Fabrics in a Radiation Hard Semiconductor Foundry," 2005 IEEE Conference, 9 pgs.

Brown, K. M., "System in package "The Rebirth of SIP"," 2004 IEEE Custom Integrated Circuits, May 2004, 6 pgs.

Chiang, et al., "Purification and Characterization of Single-Wall Carbon Nanotubes (SWNTs) Obtained from the Gas-Phase Decomposition of CO (HiPco Process)," J. Phys. Chem. B, vol. 105, 2001, pp. 8297-8301.

(56) References Cited

OTHER PUBLICATIONS

Collins, et al., "Engineering Carbon Nanotubes and Nanotube Circuits Using Electrical Breakdown," Science, 2001, vol. 292, pp. 706-709.
Crowley, et al., "512 Mb PROM with 8 layers of antifuse/Diode cells," IEEE International Solid-State Circuits Conference, vol. XLVI, Feb. 2003, pp. 284-285.
Cui, J.B., et al., "Carbon Nanotube Memory Devices of High Charge Storage Stability," Applied Physics Letters, Oct. 2002, vol. 81, No. 17, pp. 3260-3262.
Dercke, et al., "Carbon Nanotube Inter- and Intramolecular Logic Gates," Nano Letters, Sep. 2001, vol. 1, No. 9, pp. 453-456.
Fuhrer, M.S., et al., "High-Mobility Nanotube Transistor Memory," Nano Letters, 2002, vol. 2, No. 7, pp. 755-759.
Hone, J., "Phonons and Thermal Properties of Carbon Nanotubes," Topics Appl. Phys., 2001, vol. 80, pp. 273-286.
Hu, et al., "Controlled Growth and Electrical Properties of Carbon Nanotubes and Silicon Nanowires," Nature, May 1999, vol. 399, pp. 48-51.
Huai, Y., "Spin-Transfet Torque MRAM (STT-MTAM): Challenges and Prospects," AAPS Bulletin, vol. 18, No. 6, Dec. 2008, pp. 33-40.
Jiang, et al., "Performance Breakthrough in 8nm Gate-All-Around Length Gate-All Around Nanowire Transistors using Metallic Nanowire Contacts," 2008 Symposium on VLSI Technology Digest of Technical Papers, pp. 34-35.
Johnson, R.C., "IBM fellow unrolls blueprint for nano," EE Times, 3 pgs., Mar. 6, 2006, http://www.eetimes.com/showArticle.jhtml?ArticleID=181500304.
Kianian, et al., "A 3D Stackable Carbon Nanotube-based Nonvolatile Memory (NRAM)," ESSDERC, Nantero, Inc., Jun. 14, 2010, 4 pgs.
Kong, et al., "Quantum Interference and Ballistic Transmission in Nanotube Electron Wavegrinders," The American Physical Society 2001, vol. 87, No. 10, pp. 106801-1-106801-4.
Onoa, et al., "Bulk Production of Singly Dispersed Carbon Nanotubes with Prescribed Lengths," Nanotechnology, 2005, vol. 16, pp. 2799-2803.
Langer, et al., "Electrical Resistance of a Carbon Nanotube Bundle," J. Mater. Res., 1994, vol. 9, No. 4, pp. 927-932.
Novak, et al., "Nerve Agent Detection Using Networks of Single-Walled Carbon Nanotubes," Applied Physics Letters, Nov. 2003, vol. 83, No. 19, pp. 4026-4028.
Predhan, et al., "Electrical bistability and memory phenomenon in carbon nanotube-conjugated polymer matrixes," Journal of Physical Chemistry B, Materials, Surfaces, Interfaces and Biophysical, Washington D.C., Apr. 2006, vol. 110, pp. 8274-8277.
Rosendale, et al., "A 4 Megabit Carbon Nanotube-based Nonvolatile Memory (NRAM)," ESSCIRC 2010 Proceedings, pp. 478-481.
Ruecks, et al., "Carbon Nanotube-Based Nonvolatile Random Access Memory for Molecular Computing," Science, Jul. 2000, vol. 289, pp. 94-97.
Servalli, G., "A 45nm Generation Phase Change Memory Technology," IEDM 2009 Technical Digest, pp. 5.7.1-5.7.4.
Smith, et al., "Contamination Control and Pilot Manufacturing of Commercial Grade Carbon Nanotube Colloidal Formulations," 2013 SEMI Advanced Semiconductor Manufacturing Conference (ASMC 2013), 5 pages.
Snow, et al., "Random Networks of Carbon Nanotubes as an Electronic Material," Applied Physics Letters, Mar. 2003, vol. 82, No. 13, pp. 2145-2147.
Star, et al., "Nanoelectronic Carbon Dioxide Sensors,"Adv. Mater. 2004, 16, No. 22, Nov. 18, pp. 2049-2052.
Tzolov, et al., "Electronic Transport in a Controllably Grown Carbon Nanotube-Silicon Heterojunction Arrays," Phys. Rev. Lett., Feb. 2004, vol. 92, No. 7, Article 075505.
Ward, et al., "A Non-Volatile Nanoelectromechanical Memory Element Utilizing a Fabric of Carbon Nanotubes," IEEE 2004, pp. 34-38.
Wind, et al., "Vertical scaling of carbon nanotube field effect transistors using top gate electrodes," May 2002, Applied Physics Letters, vol. 80, No. 20, pp. 3817-3819.
Zhou, et al., "p-Channel, n-Channel Thin Film Transistors and p-n Diodes Based on Single Wall Carbon Nanotube Networks," Nano Letters, vol. 4, No. 10, 2004, pp. 2031-2035.
Zhou, et al., "Modulated Chemical Doping of Individual Carbon Nanotubes," Science, Nov. 2000, vol. 290, pp. 1552-1555.

\* cited by examiner

RESISTIVE CHANGE ELEMENT ARRAYS USING RESISTIVE REFERENCE ELEMENTS

CROSS-REFERENCE OF RELATED CASES

This application claims priority under 35 U.S.C. §120 and is a continuation of U.S. patent application Ser. No. 14/457,520, filed on Aug. 12, 2014, entitled Method For Dynamically Accessing and Programming Resistive Change Element Arrays and is related to the following U.S. patents, which are assigned to the assignee of the present application, and are hereby incorporated by reference in their entirety:

- U.S. Pat. No. 6,835,591, filed on Apr. 23, 2002, entitled Methods of Nanotube Films and Articles;
- U.S. Pat. No. 7,335,395, filed on Jan. 13, 2003, entitled Methods of Using Pre Formed Nanotubes to Make Carbon Nanotube Films, Layers, Fabrics, Ribbons, Elements, and Articles;
- U.S. Pat. No. 6,706,402, filed on Mar. 16, 2004, entitled Nanotube Films and Articles;
- U.S. Pat. No. 7,115,901, filed on Jun. 9, 2004, entitled Non-Volatile Electromechanical Field Effect Devices and Circuits Using Same and Methods of Forming Same; and
- U.S. Pat. No. 7,365,632, filed on Sep. 20, 2005, entitled Resistive Elements Using Carbon Nanotubes.
- U.S. Pat. No. 7,781,862, filed on Nov. 15, 2005, entitled Two-Terminal Nanotube Devices and Systems and Methods of Making Same;
- U.S. Pat. No. 7,479,654, filed on Nov. 15, 2005, entitled Memory Arrays Using Nanotube Articles with Reprogrammable Resistance;
- U.S. Pat. No. 8,217,490, filed on Aug. 8, 2008, entitled Nonvolatile Nanotube Diodes and Nonvolatile Nanotube Blocks and Systems Using Same and Methods of Making Same;
- U.S. Pat. No. 8,351,239, filed on Oct. 23, 2009, entitled Dynamic Sense Current Supply Circuit and Associated Method for Reading and Characterizing a Resistive Memory Array; and
- U.S. Pat. No. 8,000,127, filed on Nov. 13, 2009, entitled Method for Resetting a Resistive Change Memory Element.

This application is related to the following U.S. patent applications, which are assigned to the assignee of the application, and are hereby incorporated by reference in their entirety:

- U.S. patent application Ser. No. 12/536,803, filed on Aug. 6, 2009, entitled Nonvolatile Nanotube Programmable Logic Devices and a Nonvolatile Nanotube Field Programmable Gate Array Using Same; and
- U.S. patent application Ser. No. 12/873,946, filed on Sep. 1, 2010, entitled A Method for Adjusting a Resistive Change Element Using a Reference; and
- U.S. patent application Ser. No. 13/716,453 filed on Dec. 12, 2012, entitled Carbon Based Nonvolatile Cross Point Memory Incorporating Carbon Based Diode Select Devices And MOSFET Select Devices For Memory And Logic Applications.

BACKGROUND

1. Technical Field

The present disclosure relates generally to arrays of resistive change elements, and, more specifically, to improved methods for dynamically reading and programming such arrays without the need for in situ selection and current limiting elements.

2. Discussion of Related Art

Any discussion of the related art throughout this specification should in no way be considered as an admission that such art is widely known or forms part of the common general knowledge in the field.

Resistive change devices and arrays, often referred to as resistance RAMs by those skilled in the art, are well known in the semiconductor industry. Such devices and arrays, for example, include, but are not limited to, phase change memory, solid electrolyte memory, metal oxide resistance memory, and carbon nanotube memory such as NRAM™.

Resistive change devices and arrays store information by adjusting a resistive change element, typically comprising some material that can be adjusted between a number of non-volatile resistive states in response to some applied stimuli, within each individual array cell between two or more resistive states. For example, each resistive state within a resistive change element cell can correspond to a data value which can be programmed and read back by supporting circuitry within the device or array.

For example, a resistive change element might be arranged to switch between two resistive states: a high resistive state (which might correspond to a logic "0") and a low resistive state (which might correspond to a logic "1"). In this way, a resistive change element can be used to store one binary digit (bit) of data.

Or, as another example, a resistive change element might be arranged to switch between four resistive states, so as to store two bits of data. Or a resistive change element might be arranged to switch between eight resistive states, so as to store four bits of data. Or a resistive change element might be arranged to switch between 2" resistive states, so as to store n bits of data.

Within the current state of the art, there is an increasing need to scale and increase the cell density of arrays of resistive change element arrays. However, as technology is developed within the state of the art to provide increasingly smaller resistive change elements, the physical dimensions of individual array cells within a resistive change element array becomes, in certain applications, limited by the physical dimensions of selection circuitry used within traditional resistive change element array cells. To this end, it would be advantageous if a method for reading and programming arrays of resistive change elements were realized such that individual array cells could be rapidly accessed (read) or adjusted (programmed) without the need for in situ selection circuitry or other current controlling devices within each cell.

SUMMARY

The present disclosure relates to dynamic methods for programming and reading arrays of resistive change elements and, more specifically, to such methods wherein cells within an array can be rapidly programmed or read without the need for in situ selection or current controlling circuitry within each cell.

In particular, the present disclosure provides a method for determining the resistive state of at least one resistive change element within a resistive change element array. This method first comprises providing a resistive change element array, this resistive change element array comprising a plurality of word lines, a plurality of bit lines, and a plurality of resistive change elements. Within the resistive change element array each resistive change element has a first terminal and a second terminal. The first terminal of each resistive change element is in electrical communication with a word line and the second terminal of each resistive change element is in electrical communication with a bit line. This method further comprises charging all of the bit lines and all of the word lines within the resistive change element array to a preselected voltage level simultaneously. This method further comprises selecting one word line within the resistive change element array and allowing the selected word line to float while driving all of the other word lines and all of the bit lines to ground. The method further comprises observing the current through those resistive change elements that are in electrical communication with the selected word line as the selected word line discharges through those resistive change elements in order to measure at least one read current value for at least one resistive change element. This method further comprises determining from the at least one read current value the resistive state of at least one resistive change element.

Under one aspect of the present disclosure, this method for reading a resistive change element also comprises allowing the selected word line to discharge through at least one resistive reference element. And the resistive state of the at least one resistive change element is determined by comparing at least one read current value to a current value measured through the at least one resistive reference element.

Further, the present disclosure also provides a method for adjusting the resistive state of at least one resistive change element within a resistive change element array. This method comprises first providing a resistive change element array. This resistive change element array comprises a plurality of word lines, a plurality of bit lines, and a plurality of resistive change elements. Within the resistive change element array each resistive change element has a first terminal and a second terminal. The first terminal of each resistive change element is in electrical communication with a word line, and the second terminal of each resistive change element is in electrical communication with a bit line. This method further comprises charging all of the bit lines and all of the word lines within the resistive change element array to a preselected voltage level simultaneously. This method further comprises selecting one word line within said resistive change element array and driving the selected word to ground while allowing all of the other word lines and all of the bit lines to float. This method further comprises discharging those bit lines in electrical communication with those resistive change elements in electrical communication with the selected word line through those resistive change elements to provide at least one programming current through at least one resistive change element. Within this method the at least one programming current adjusts the electrical resistance of at least one resistive change element from a first resistive state to a second resistive state.

Under another aspect of the present disclosure, within this method for adjusting the resistive state of a resistive change element the first resistive state is lower than the second resistive state.

Under another aspect of the present disclosure, within this method for adjusting the resistive state of a resistive change element the first resistive state is higher than the second resistive state.

Under another aspect of the present disclosure, within this method for adjusting the resistive state of a resistive change element the resistive state of every resistive change element in electrical communication with the selected word line is adjusted simultaneously.

Under another aspect of the present disclosure, within this method for adjusting the resistive state of a resistive change element the first resistive state corresponds to a first logic value and the second logic state corresponds to a second logic value.

Under another aspect of the present disclosure, within this method for adjusting the resistive state of a resistive change element all the resistive change elements in electrical communication with the selected word line are programmed with the same logic value after the selected word line has discharged.

Further, the present disclosure also provides a method for adjusting the resistive state of a single resistive change element within a resistive change element array. This method comprises first providing a resistive change element array, this resistive change element array comprising a plurality of word lines, a plurality of bit lines, and a plurality of resistive change elements. Within the resistive change element array each resistive change element has a first terminal and a second terminal wherein. The first terminal of each resistive change element is in electrical communication with a word line, and the second terminal of each resistive change element is in electrical communication with a bit line. This method further comprises first charging all of the bit lines and all of the word lines within the resistive change element array to a preselected voltage level simultaneously. The method further comprises selecting one word line and one bit line within the resistive change element array and allowing the selected word line to float and driving the selected bit line to ground while driving all of the other word lines to ground and pulling all of the other bit lines to ground via a current limiting path. This method further comprises discharging the selected word line through a single resistive change element in electrical communication with the selected word line and the selected bit line to provide a programming current through the single resistive change element. Within this method of the present disclosure the programming current adjusts the electrical resistance of the single resistive change element from a first resistive state to a second resistive state.

Under another aspect of the present disclosure, within this method for adjusting the resistive state of a single resistive change element the first resistive state is lower than the second resistive state.

Under another aspect of the present disclosure, within this method for adjusting the resistive state of a single resistive change element the first resistive state is higher than the second resistive state.

Under another aspect of the present disclosure, within this method for adjusting the resistive state of a single resistive change element the first resistive state corresponds to a first logic value and the second logic state corresponds to a second logic value.

Under another aspect of the present disclosure, within this method for adjusting the resistive state of a single resistive change element the current limiting path is sufficient to prevent a discharge current through an unselected resistive change element from being large enough to adjust the resistive state of the unselected resistive change element.

Under another aspect of the present disclosure, within the dynamic programming and reading methods presented, the resistive change elements are two-terminal nanotube switching elements.

Under another aspect of the present disclosure, within the dynamic programming and reading methods presented, the resistive change elements are metal oxide memory elements.

Under another aspect of the present disclosure, within the dynamic programming and reading methods presented, the resistive change elements are phase change memory elements.

Under another aspect of the present disclosure, within the dynamic programming and reading methods presented, the resistive change element array is a memory array.

Other features and advantages of the present disclosure will become apparent from the following description of the invention, which is provided below in relation to the accompanying drawings.

DETAILED DESCRIPTION

The present disclosure relates to resistive change element arrays and methods for programming and reading the resistive states of resistive change elements within an array. As will be discussed in detail below, the dynamic programming and reading methods of the present disclosure are well suited for use within arrays of 1-R resistive change element cells. These 1-R resistive change element cells (shown in FIGS. 3A and 4 and discussed in detail below with respect to those figures) are characterized in that these cells are comprised only of a two-terminal resistive change element and do not include any in situ selection circuitry or other current limiting elements. The dynamic programming and reading methods of the present disclosure include first pre-charging all of the array lines within a resistive change element array simultaneously and then grounding certain array lines while allowing other array lines to "float" in order to direct discharge currents through only selected cells. In this way, as described in detail below, the methods of the present disclosure can be used to reliably and rapidly program—that is, adjust the resistive state of a resistive change element from a first value to a desired second value—and read—that is, determine the resistive state of a resistive change element within one or more cells within an array—without the need for certain design and layout restrictions that are inherent with many conventional programming and reading methods.

Several process steps as described within the methods of the present disclosure require that one or more array lines be "floated" after being charged to a desired voltage level. It should be noted that within the scope of the present disclosure, "floating" an array line is driving that line with high impedance (or simply disconnecting the line from the circuit element used to drive the desired voltage onto the line) such that the pre-charged voltage on the array line is temporarily retained due to line capacitance. As will be shown in detail below, this "floating" technique is used within the dynamic programming and dynamic reading methods of the present disclosure to provide array line discharge paths through selected cells (and prevent such paths through unselected cells) without the need for selection circuitry in situ with array cells.

Figure 3A:
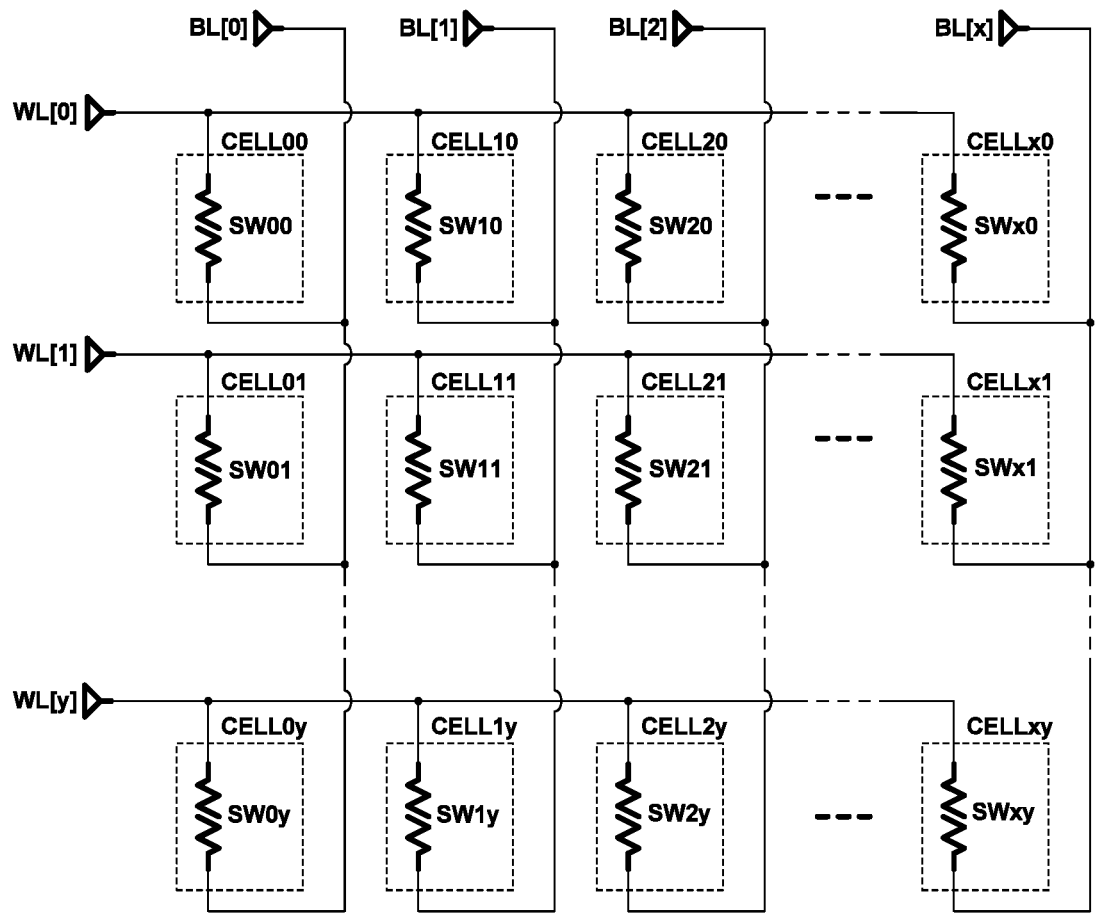
FIG. 3A is a simplified schematic illustrating an exemplary typical architecture for an array of 1-R resistive change element cells wherein no selection devices or other current limiting circuitry are used within the cells of the array.
Figure 4:
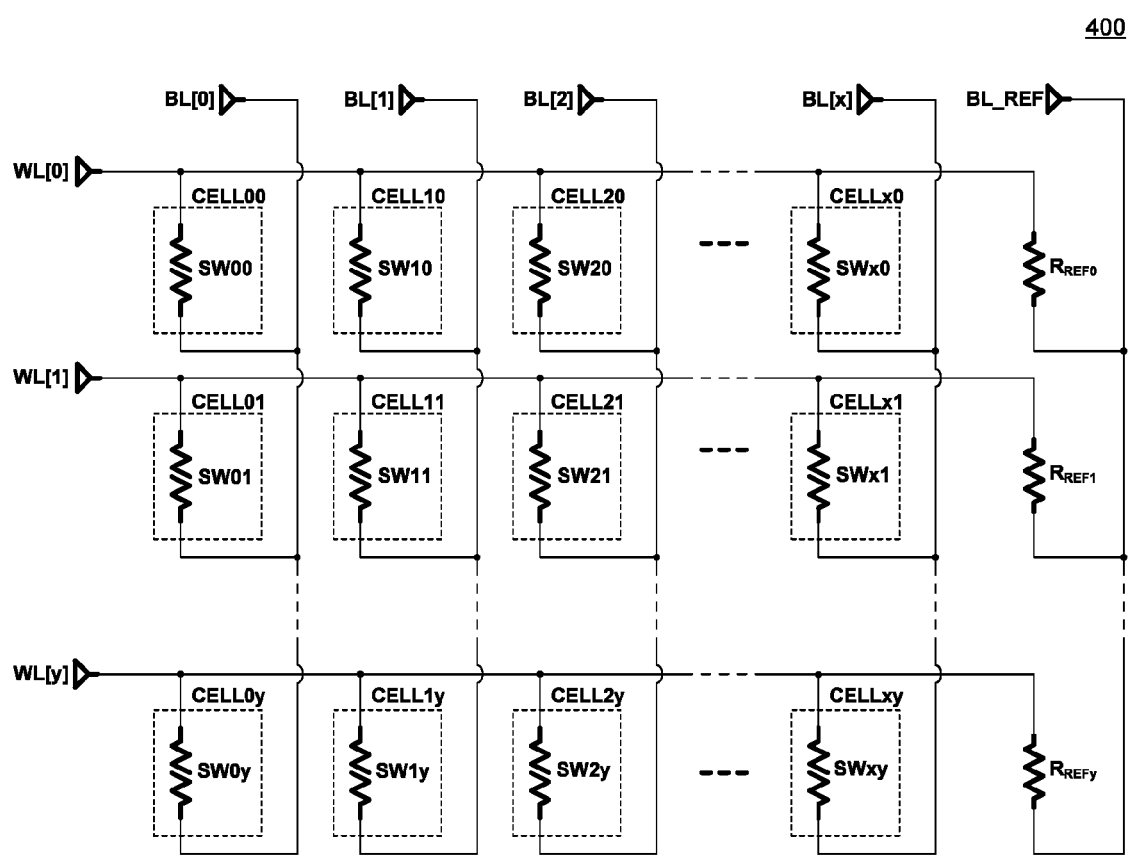
FIG. 4 is a simplified schematic illustrating an exemplary architecture for an array of 1-R resistive change element cells wherein no selection devices or other current limiting circuitry are used within the cells of the array (as with FIG. 3A) but also including reference elements for each word line, as described within certain embodiments of the present disclosure.
Figure 5:
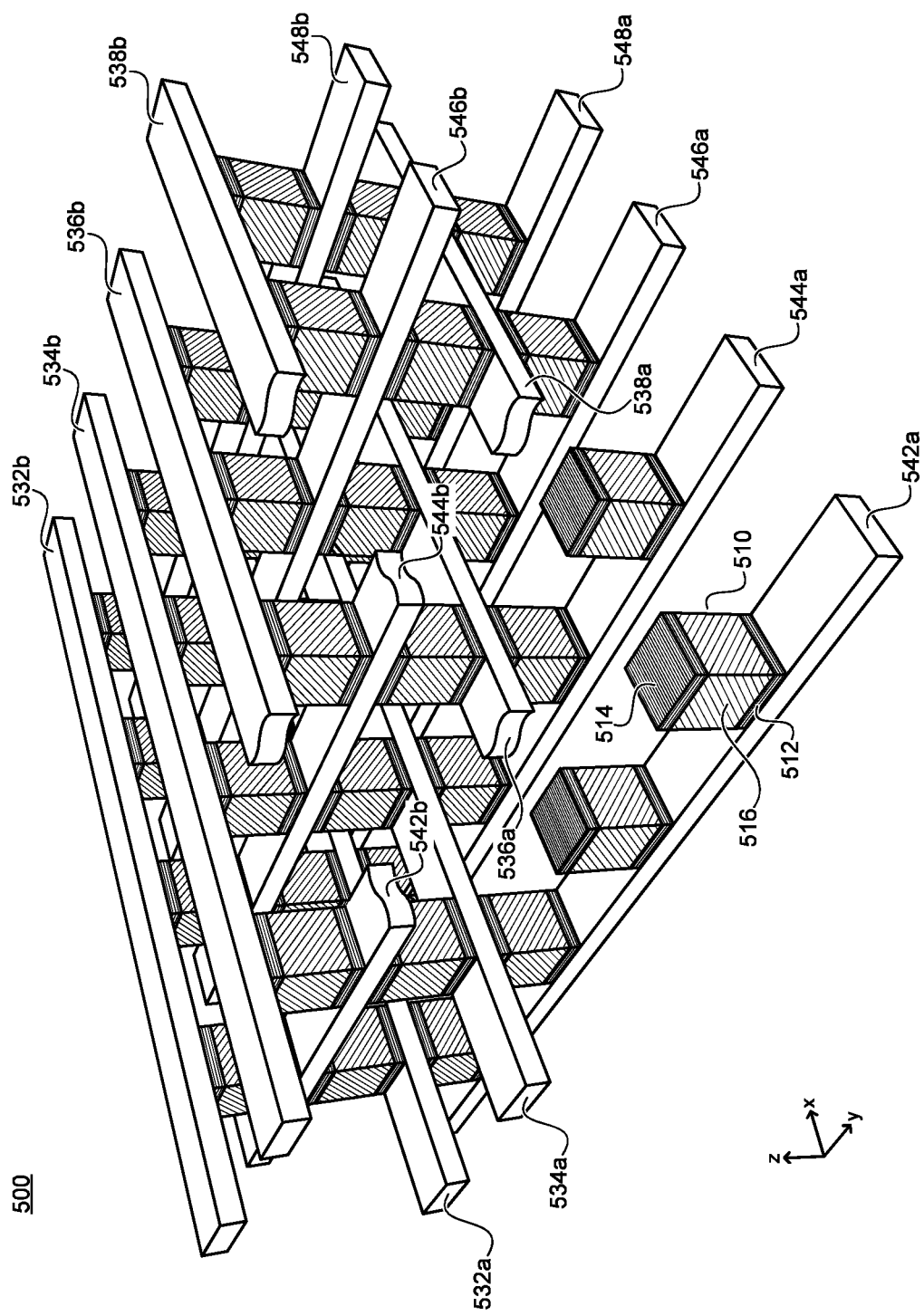
FIG. 5 is a perspective drawing illustrating the layout of a 3D array of 1-R resistive change element cells.

As will be described in detail below, the present disclosure teaches methods for programming (that is performing SET and RESET operations) and accessing (that is, performing READ operations) on resistive change elements within an array. Within certain embodiments of the present disclosure, arrays of resistive change elements are arranged such that a first terminal of each resistive change element is electrically coupled to a word line and a second terminal of each resistive change element is electrically coupled to a bit line. In this way, within such arrangements, each resistive change element is uniquely accessible via a particular word line and bit line combination. FIGS. 3A, 4, and 5 (discussed in detail below) provide examples of such resistive change element arrays. Some aspects of the present disclosure provide methods (again, as will be explained in detail below) for programming and accessing the resistive change elements within such an array without the need for local, in situ selection circuitry or current limiting devices.

To this end, a multi-cell programming operation (that is a SET or a RESET operation, as defined herein) according to some aspects of the present disclosure involves pre-charging a word line associated with a group of selected cells to a required SET or RESET voltage. The other word lines and bit lines in the array are charged simultaneously such that no cell within the array experiences a voltage drop during the pre-charge process step. Once all word lines and bit lines in the array are sufficiently charged, the word line associated with the selected cells is driven at high impedance. The line capacitance inherent within the selected word line retains the pre-charged programming voltage. The bits lines associated with the selected cells are driven to ground allowing the retained programming voltage to discharge through the selected cells. The remaining bit lines and word lines remain driven (simultaneously) at voltages as required to prevent voltage drops (and, in turn, undesired electrical currents) across (through) unselected cells. In this way, the AC transient behavior of the resistive change element array can be used to selectively provide dynamic programming currents through a group of selected resistive change element cells within that array without the need for local, in situ selection circuitry within each array cell. This multi-cell programming method according to the present disclosure is described in more detail with the discussion of FIGS. 8A and 8B below.

Further, a single cell programming operation (that is a SET or RESET operation on a single cell within a resistive change element array) can also be performed using the methods of the present disclosure. As described above with respect to the multi-cell programming operation, the word line associated with the selected cell is pre-charged to a required SET or RESET voltage while the other array lines are simultaneous charged to prevent any voltage drop across any of the array cells prior to the programming operation. Once all lines have had time to sufficiently charge, the selected word line is driven at high impedance and allowed to float. Again, the programming voltage applied remains on the selected word line due to the line's inherent line capacitance. The bit line associated with the selected cell is then driven to ground such as to allow the programming voltage retained on the selected word line to discharge through the selected cell. In the case of a single cell programming operation, the bit lines associated with other cells associated with the selected word line are current limited remotely (that is, for example, by the driving circuitry located outside of the array or through a pull down resistor outside of the array). In this way, the programming voltage temporally stored on the selected word line is allowed to discharge only through the selected cell. This method can also be used to program a subset of cells associated with a single word line or bit line by remotely current limiting only the bit lines associated with the unselected cells. Again, in this way, the AC transient behavior of the resistive change element array can be used to selectively provide dynamic programming currents through a single selected resistive change element cell within that array (or a subset of cells on a word or bit line). This single-cell programming method according to the present disclosure is described in more detail with the discussion of FIGS. 9A and 9B below.

The methods of the present disclosure as briefly introduced above (that is, this pre-charge, float, and selective discharge method as described above with respect to programming operations) can also provide accessing methods (that is READ operations) for selected cells within arrays of resistive change elements. Such accessing operations are described in greater detail within the discussion of FIGS. 7A and 7B below. Within some embodiments of the present disclosure, these READ operations also make use of a reference element with the array itself (as depicted, for example, in FIG. 4). As will be described in more detail below, READ voltages (pre-charged onto selected word lines as described above) are allowed to discharge through these reference elements simultaneously with the selected cell or cells. In this way, the voltage discharge of a selected cell (or cells) can simply be compared to the voltage discharge of a reference element in the same environment, instead of being measured and compared to some expected value outside the array. As will be discussed below, in certain applications the use of reference elements in this way can provide faster and lower voltage READ operations. The use of such reference elements within the accessing methods of the present disclosure are described in more detail within the discussion of FIGS. 4, 7A, and 7B below.

It should be noted that although the preceding discussions of programming and accessing methods of resistive change elements according to methods of the present disclosure describe programming and read currents flowing from word line to bit line, the methods of the present disclosure are not limited in this regard. Indeed, as will be described in detail below, a programming or read current could be pre-charged and floated onto a bit line associated with a selected cell (or cells), for example, and the word line (or lines) associated with the selected cell (or cells) grounded to provide programming and read currents that flow from bit line to word line. As such, the methods of the present disclosure provide programming and accessing methods compatible with bi-polar (that is, dual polarity) resistive change element operations.

Resistive change cells store information through the use of a resistive change element within the cell. Responsive to electrical stimulus, this resistive change element can be adjusted between at least two non-volatile resistive states. Typically, two resistive states are used: a low resistive state (corresponding, typically, to a logic '1,' a SET state) and a high resistive state (corresponding, typically, to a logic '0,' a RESET state). In this way, the resistance value of the resistive change element within the resistive change element cell can be used to a store a bit of information (functioning, for example, as a 1-bit memory element). According to other aspects of the present disclosure, more than two resistive states are used, allowing a single cell to store more than one bit of information. For example, a resistive change memory cell might adjust its resistive change element between four non-volatile resistive states, allowing for the storage of two bits of information in a single cell.

Within the present disclosure the term "programming" is used to describe an operation wherein a resistive change element is adjusted from an initial resistive state to a new desired resistive state. Such programming operations can include a SET operation, wherein a resistive change element is adjusted from a relatively high resistive state (e.g., on the order of 10 M$\Omega$) to a relatively low resistive state (e.g., on the order of 100 k$\Omega$). Such programming operations (as defined by the present disclosure) can also include a RESET operation, wherein a resistive change element is adjusted from a relatively low resistive state (e.g., on the order of 100 kΩ) to a relatively high resistive state (e.g., on the order of 1 MΩ). Additionally, a "READ" operation, as defined by the present disclosure, is used to describe an operation wherein the resistive state of a resistive change element is determined without significantly altering the stored resistive state.

Resistive change elements can use, for example, two-terminal nanotube switching elements, phase change memory, metal oxide memory cells, or conductive bridge memory (CBRAM) as well as other materials and designs.

Resistive change elements (and arrays thereof) are well suited for use as non-volatile memory devices for storing digital data (storing logic values as resistive states) within electronic devices (such as, but not limited to, cell phones, digital cameras, solid state hard drives, and computers). However, the use of resistive change elements is not limited to memory applications. Indeed, arrays of resistive change elements as well as the advanced architectures taught by the present disclosure could also be used within logic devices or within analog circuitry.

Typically, a resistive change element is adjusted (programmed) between different resistive states by applying electrical stimulus across the element. For example, one or more programming pulses of specific voltages, currents, and pulse widths (as required by the needs of a specific application) can be applied across a resistive change element to adjust the electrical resistance of a resistive change element from an initial resistance value to a new desired resistance value. A second programming pulse (or pulses) can be used to adjust the resistive change element back to the first initial resistive state or, depending on the specific application, a third resistive state.

Further, the state of a resistive change element can be determined, for example, by applying a DC test voltage across the resistive change element and measuring the current through the resistive change element. In some applications this current can be measured using a power supply with a current feedback output, for example, a programmable power supply or a sense amplifier. In other applications this current can be measured by inserting a current measuring device in series with the resistive change element. Alternatively, the state of a resistive change element can also be determined, for example, by driving a fixed DC current through the resistive change element and measuring the resulting voltage across the resistive change element. In both cases, the electrical stimulus applied to resistive change element is limited such as to not alter the resistive state of the element. In this way, a READ operation can determine the state of a resistive change memory element.

A resistive change element can be formed from a plurality of materials, such as, but not limited to, metal oxide, solid electrolyte, phase change material such as a chalcogenide glass, and carbon nanotube fabrics. For example, U.S. Pat. No. 7,781,862 to Bertin et al., incorporated herein by reference, discloses a two terminal nanotube switching device comprising a first and second conductive terminals and a nanotube fabric article. Bertin teaches methods for adjusting the resistivity of the nanotube fabric article between a plurality of nonvolatile resistive states. In at least one embodiment, electrical stimulus is applied to at least one of the first and second conductive elements such as to pass an electric current through said nanotube fabric layer. By carefully controlling this electrical stimulus within a certain set of predetermined parameters (as described by Bertin in U.S. Pat. No. 7,781,862) the resistivity of the nanotube article can be repeatedly switched between a relatively high resistive state and relatively low resistive state. In certain embodiments, these high and low resistive states can be used to store a bit of information.

As described by the incorporated references, a nanotube fabric as referred to herein for the present disclosure comprises a layer of multiple, interconnected carbon nanotubes. A fabric of nanotubes (or nanofabric), in the present disclosure, e.g., a non-woven carbon nanotube (CNT) fabric, may, for example, have a structure of multiple entangled nanotubes that are irregularly arranged relative to one another. Alternatively, or in addition, for example, the fabric of nanotubes for the present disclosure may possess some degree of positional regularity of the nanotubes, e.g., some degree of parallelism along their long axes. Such positional regularity may be found, for example, on a relatively small scale wherein flat arrays of nanotubes are arranged together along their long axes in rafts on the order of one nanotube long and ten to twenty nanotubes wide. In other examples, such positional regularity maybe found on a larger scale, with regions of ordered nanotubes, in some cases, extended over substantially the entire fabric layer. Such larger scale positional regularity is of particular interest to the present disclosure.

While some examples of resistive change cells and elements within the present disclosure specifically reference carbon nanotube based resistive change cells and elements, the methods of the present disclosure are not limited in this regard. Indeed, it will be clear to those skilled in the art that the methods of the present disclosure are applicable to any type of resistive change cell or element (such as, but not limited to, phase change and metal oxide).

Figure 1:
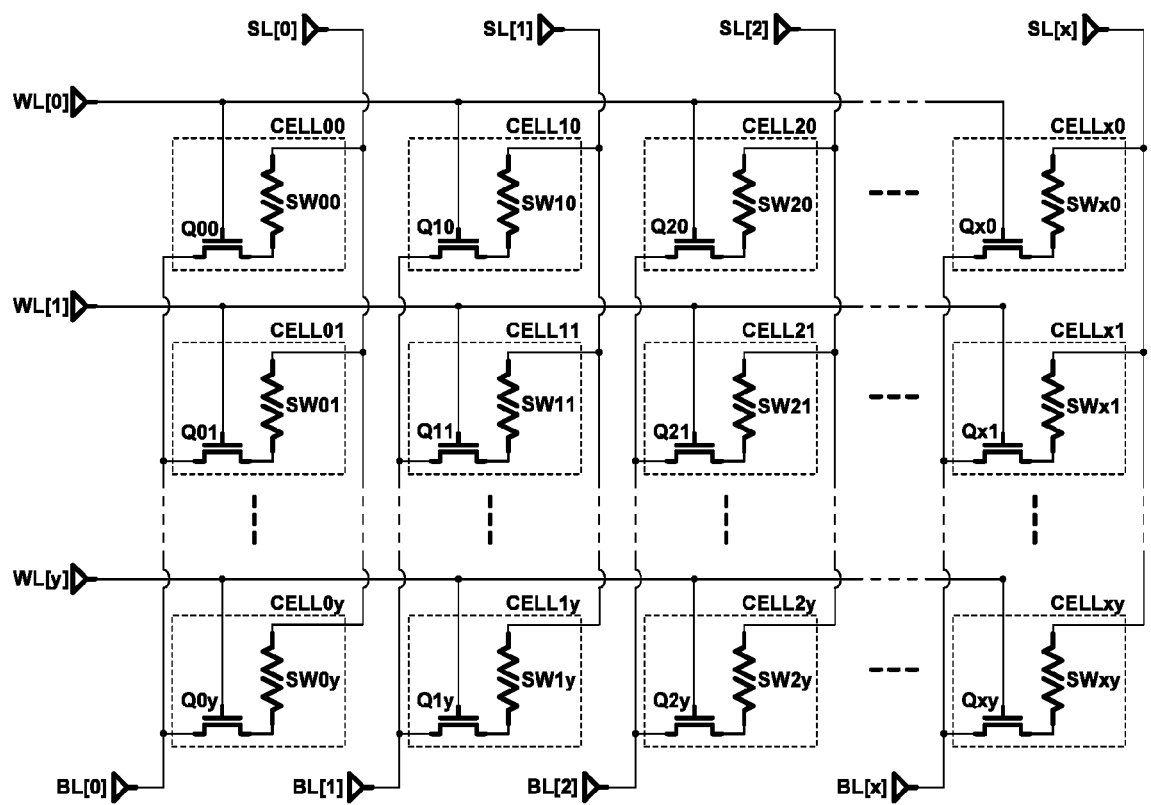
FIG. 1 is a simplified schematic illustrating an exemplary typical architecture for an array of resistive change elements wherein FET selection devices are used within the cells of the array.

Referring now to FIG. 1, an exemplary architecture for a resistive change element array 100 is illustrated in a simplified schematic diagram. Within the exemplary architecture 100, field effect transistors (FETs) are used within each resistive change element cell to provide a selectability function to that cell. That is, the FET devices (Q00-Qxy) provide a means to access a desired resistive change element while isolating unselected elements.

Specifically looking now to FIG. 1, the array 100 comprises a plurality of cells (CELL00-CELLxy), each cell including a resistive change element (SW00-SWxy) and a selection device (Q00-Qxy). The individual array cells (CELL00-CELLxy) within resistive change array 100 are selected for reading and programming operations using arrays of source lines (SL[0]-SL[x]), word lines (WL[0]-WL[y]), and bit lines (BL[0]-BL[x]) as will be described below.

Responsive to control signals applied to the word lines (WL[0]-WL[y]), the selection devices (Q00-Qxy) within the individual array cells permit access or electrically isolate the resistive change elements (SW00-SWxy). A specific individual cell (for example, CELL00) can be accessed by driving the associated word line (WL[0] for CELL00) with electrical stimuli sufficient to turn on the desired cell's selection FET (Q00 for CELL00). The electrical stimuli required to program (that is, SET or RESET) or READ the selected resistive change element (SW00 for CELL00) can then be applied across the bit line (BL[0] for CELL[0]) and the select line (SL[0] for CELL00) associated with the selected cell. With the selection device (Q00 in this example) enabled, a conductive path is provided between the bit line and the select line through the selected resistive change element, and the provided programming or reading stimuli is driven across only the selected resistive change element (SW00 for CELL00). The other cells associated with the bit line and select line being used are on separate word lines and are thus not enabled. In this way, the exemplary resistive change element array architecture 100 of FIG. 1 provides a means for individually accessing and addressing all of the cells within the array and directing applied electrical stimuli sufficient to program (that is, SET or RESET) or READ any of the cells within the array.

As described above, the resistive change element array architecture 100 of FIG. 1 provides an access and addressing scheme that requires each cell be responsive to three separate control lines. Further, it requires that each cell include an in situ FET select device, and further that this FET select device be power rated high enough to withstand the programming voltages required by the resistive change elements being used within the array. This can, in certain applications, result in an FET selection device that is significantly large as compared to the physical size of the resistive change element being used or even as compared to the desired physical dimension boundaries of an array cell. As resistive change element arrays are scaled down and cell densities increased, these and other design requirements of the array architecture 100 of FIG. 1 can represent, within certain applications, significant limitations with respect to the both circuit design and scaling.

Figure 2:
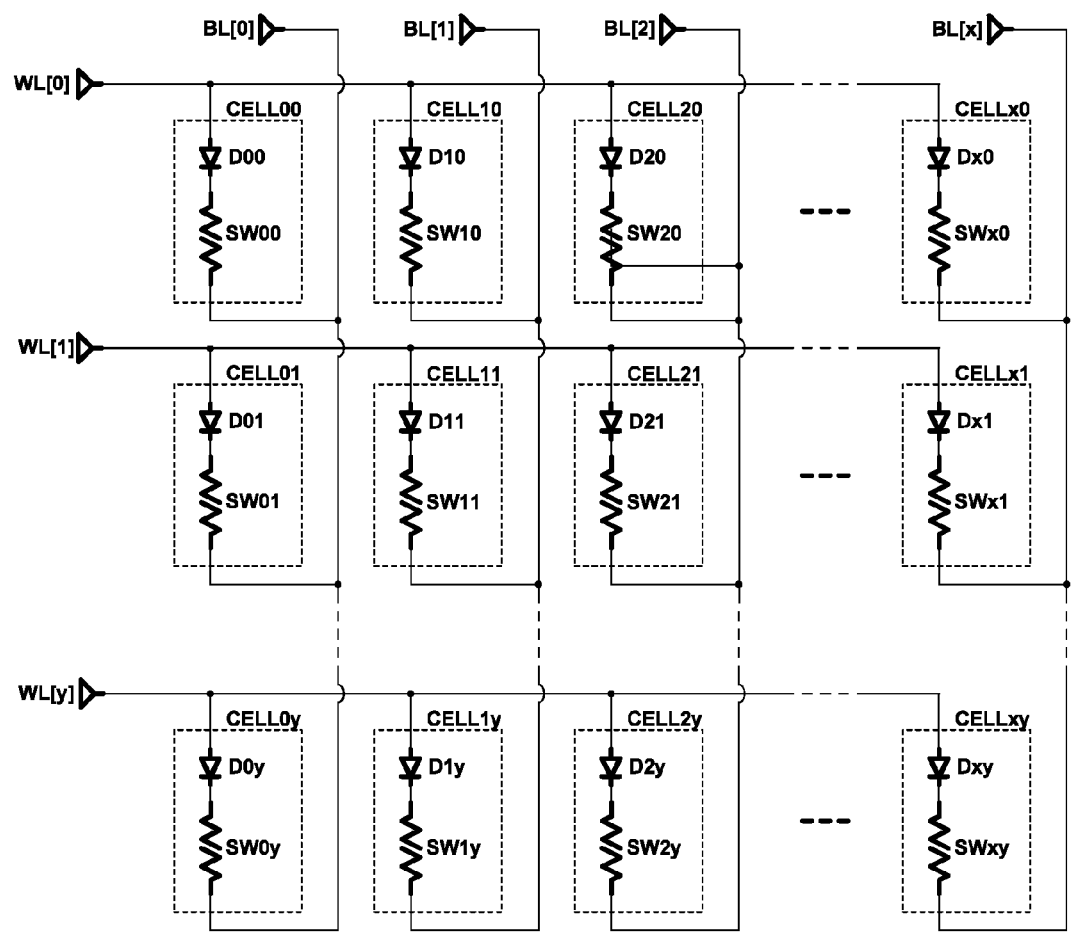
FIG. 2 is a simplified schematic illustrating an exemplary typical architecture for an array of resistive change elements wherein diode selection devices are used within the cells of the array.

Referring now to FIG. 2, a second exemplary architecture for a resistive change element array 200 is illustrated in a simplified schematic diagram. Within the exemplary architecture 200, diodes are used within each resistive change element cell to provide a selectability function to the cell. That is, the diode devices (D00-Dxy) provide a means to access a desired resistive change element while isolating unselected elements.

Specifically looking now to FIG. 2, the array 200 comprises a plurality of cells (CELL00-CELLxy), and each cell comprises a resistive change element (SW00-SWxy) in series with a selection device (D00-Dxy). The individual array cells (CELL00-CELLxy) within resistive change element array 200 are selected for reading and programming operations using arrays of word lines (WL[0]-WL[y]) and bit lines (BL[0]-BL[x]) as will be described below.

By driving its arrays of words lines (WL[0]-WL[y]) and bit lines (BL[0]-BL[x]) with a specific bias, the resistive change element array architecture 200 of FIG. 2 can enable a selected array cell by forward biasing that cell's selection diode while either reverse biasing or simply providing no voltage drop across the section diodes of the remaining unselected cells. For example, to access CELL00 a sufficient READ, SET, or RESET voltage (or current) is applied to WL[0] while BL[0] is driven to ground (0V). The remaining word lines (WL[1]-WL[y]) are driven to ground (0V), and the remaining bit lines (BL[1]-BL[x]) are driven at the same voltage supplied to WL[0]. In this way, the selection diodes within the remaining cells on the selected bit line (BL[0])—that is, CELL01-CELL0y—remain unbiased, each of the cells seeing 0V on both its associated word line and its associated bit line. Similarly, the selection diodes within the remaining cells on the selected word line (WL[0])—that is, CELL10-CELLx0—also remain unbiased, each of those cells seeing the applied programming or READ voltage on both its associated word line and its associated bit line. And finally, the selection diodes within the remaining cells in the array—that is, CELL11-CELLxy—are reversed biased, each of those cells seeing 0V on its associated word line and the applied programming voltage or READ voltage on its associated bit line. In this way, only D00 is forward biased, and the applied programming or READ voltage (or current) is applied only over the selected resistive change element SW00.

As described above, the resistive change element array architecture 200 of FIG. 2 provides an addressing scheme that requires each cell be responsive to only two separate control lines as compared with the three control lines required by the array architecture 100 of FIG. 1. While this represents a significant simplification in architecture and layout, the array architecture 200 of FIG. 2 still requires that each cell include an in situ selection device (a diode in this case). As with the FET selection device of array architecture 100 of FIG. 1, this selection diode must be power rated high enough to withstand the programming voltages required by the resistive change elements being used within the array— this includes a reverse bias rating greater than the programming voltage and current required by the resistive change element being used. As with the FET selection devices of FIG. 1, this can, in certain applications, result in a diode selection device that is significantly large as compared to the physical size of the resistive change element being used or even as compared to the desired physical dimension boundaries of an array cell. Additionally, the array architecture 200 of FIG. 2 does not permit bipolar operation of the resistive change elements. That is, programming (SET and RESET) currents and READ currents can only be applied in only one direction: the polarity associated with the forward bias direction of the selection diodes. In certain applications, bipolar operation—for example, wherein a SET operation would be performed with an electric current flowing through a resistive change element from a bit line to word line, and a RESET operation would be performed with a current flowing from a word line to a bit line—is desirable within a programming scheme for a particular resistive change element technology or configuration. As resistive change element arrays are scaled down and cell densities increased, these and other design requirements of the array architecture 200 of FIG. 2 can represent, within certain applications, significant limitations with respect to the both circuit design and scaling.

Referring now to FIG. 3A, a third exemplary architecture for a resistive change element array 301 is illustrated in a simplified schematic diagram. Within the exemplary architecture 301, no selection devices or other current limiting elements are used within the resistive change element cells. That is, each cell is comprised only of a resistive change element that is accessed via two control lines (a word line and a bit line).

As with the array architecture 200 detailed in FIG. 2, the array architecture 301 of FIG. 3A can address individual resistive change cells within the array by driving the word lines and bit lines with a specific bias. In the absence of any selection devices within the individual array cells (CELL00-CELLxy), an access operation to array architecture 301 must provide a sufficient electrical stimulus—as required for a programming (SET or RESET) or READ operation—to a selected array cell and, at the same time, prevent the other cells in the array from experiencing any electrical stimuli that would alter their stored resistive state.

For example, to access CELL00 within array architecture 301 of FIG. 3A, a sufficient READ, SET, or RESET voltage (or current) is applied to WL[0] while BL[0] is driven to ground (0V). The remaining word lines (WL[1]-WL[y]) and the remaining bit lines (BL[1]-BL[x]) are driven at half the voltage (or current) supplied to WL[0]. In this way, only half of an applied programming or READ voltage (or current) is applied to the resistive change elements within the remaining cells on the selected bit line (BL[0])—that is, CELL01-CELL0y—and within the remaining cells on the selected word line (WL[0])—that is, CELL10-CELLx0. That is, CELL01-CELL0y each see half of the applied programming or READ voltage on their associated word line and 0V on their associated bit lines, and CELL10-CELLx0 see the full programming or READ voltage on their associated word lines but only half the programming or READ voltage on their associated bit line. The remaining cells in the array—that is, CELL11-CELLxy—are unbiased, each of those cells seeing half of the applied programming or READ voltage (or current) on both its associated word line and on its associated bit line, resulting in no voltage drop or current flow across/through the resistive change elements in those cells. In this way, the applied programming or READ voltage is applied only over the selected resistive change element SW00, and while some of the unselected cells within the array are partially biased during the access and addressing operation, the electrical stimuli applied to those cells is not sufficient to alter the resistive state of those cells or disturb the programming or READ operation being performed on the selected cell.

Figure 3B:
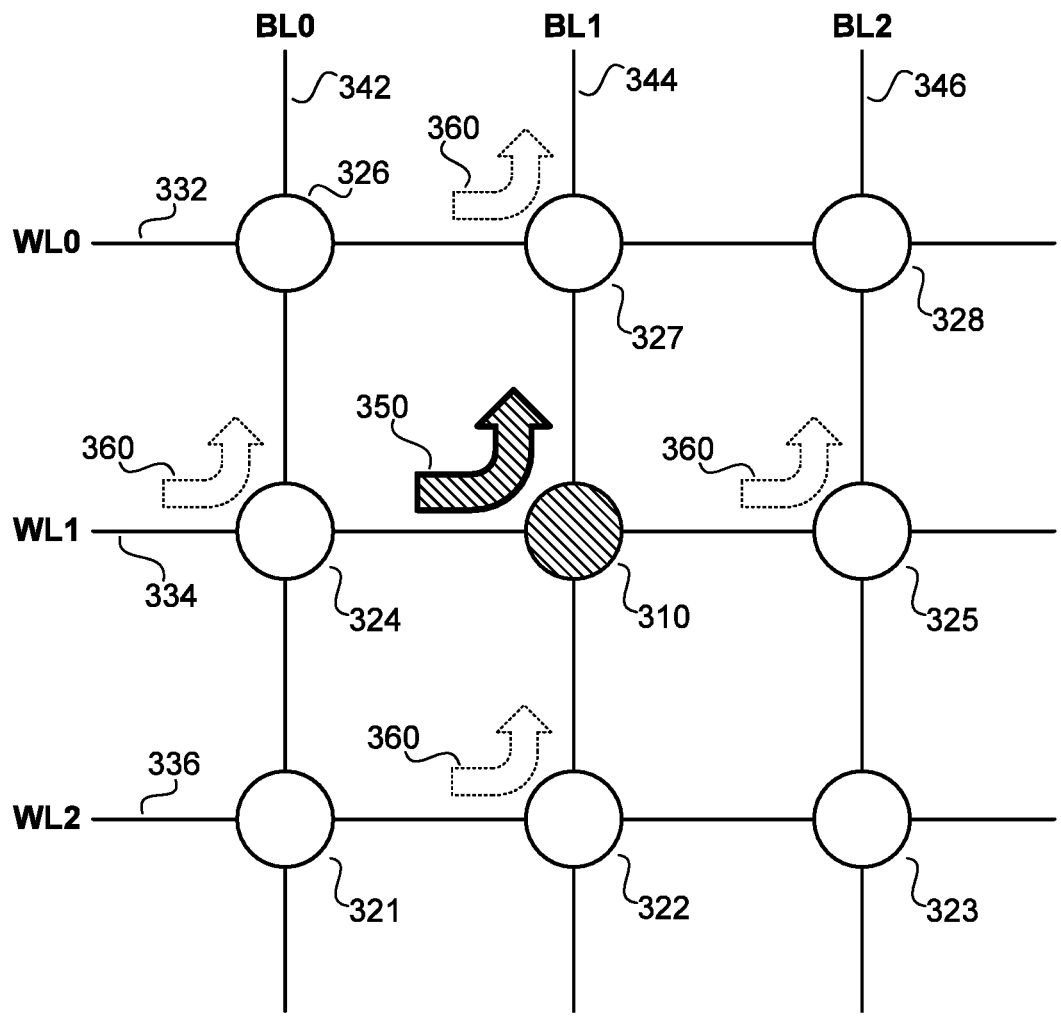
FIG. 3B is a diagram illustrating parasitic current flows present within the 1-R resistive change element array architecture of FIG. 3A during a static DC programming or read operation.

FIG. 3B is a diagram 302 illustrating the electric currents through a selected cell and also the cells adjacent to a selected cell during a conventional static DC programming or READ operation performed on the 1-R resistive change element array of FIG. 3A (as is described with respect to FIG. 3A above). Within the diagram 302, the selected cell 310 is accessed by driving a sufficient programming (SET or RESET) or READ voltage (such voltage requirements determined by the specific needs of a particular application or type of resistive change element being used) onto WL1 and pulling BL1 down to ground (0V). Responsive to this applied electrical stimuli, a programming or READ current 350 is generated from WL1 to BL1 through the selected resistive change cell 310. Additionally (as described in detail above with respect to FIG. 3A), a voltage at half the level of the voltage applied to WL1 is applied to the unselected word lines (WL0 and WL2) and the unselected bit lines (BL0 and BL2). In this way, unselected cells 321, 323, 326, and 328 remain unbiased (each of these cells seeing half of the applied programming or READ voltage on both its associated bit line and its associated word line). And unselected cells 322, 324, 325, and 327 become biased at half the voltage applied to WL1, generating a parasitic current 360 through those cells. As described above, with careful selection of programming voltages, currents, and design parameters of the resistive change elements themselves, these parasitic currents 360 remain insufficient to alter the resistive state of unselected cells 322, 324, 325, and 327 or to disturb the programming or READ operation on selected cell 310.

As discussed above, the array architecture 301 detailed in FIG. 3A provides a circuit structure that, as with the array architecture 200 of FIG. 2, requires each cell be responsive to only two separate control lines as compared with the three control lines required by the array architecture 100 of FIG. 1. Further array architecture 301 as detailed in FIG. 3A does not require a selection device in situ with each resistive change element, and array architecture 301 allows for bipolar operation (that is, programming or READ currents can flow from word line to bit line or bit line to word line, as befits the needs of a specific application or a specific resistive change element technology). U.S. patent application Ser. No. 13/716,453 to Bertin et al. incorporated by reference herein in its entirety, teaches this type of architecture for a resistive change element array as describes some methods (as discussed above) for programming and reading cells within such an array. Within Ser. No. 13/716, 453, Bertin terms this type of resistive change element cell—wherein the array cell consists only of a two terminal resistive change element—a 1-R cell.

This 1-R cell array architecture 301 detailed in FIG. 3A (and discussed within Ser. No. 13/716,453 to Bertin) represents a further significant improvement and simplification with respect to circuit architecture and layout (as compared with array architectures 100 and 200 of FIGS. 1 and 2) for certain applications. For example, scaling of cell size within array architecture 301 is limited only by the physical dimension requirements of the resistive change elements themselves. Further, as each array cell only includes one device (the resistive change element itself) and two interconnections (a bit line electrically coupled to the first terminal of the resistive change element a word line electrical coupled to the second terminal), the complexity of the resistive change element array is significantly reduced, providing—within certain applications—numerous benefits with respect to ease of fabrication, cost, increased ability for scaling, and circuit integration. As such, the simplified array architecture 301 as detailed in FIG. 3A (or a similar variation, such as, for example, the array structure shown in FIG. 4) is highly desirable as the state of the art continues to demand higher density resistive change element arrays.

However, while array architecture 301 (and similar variations) are highly desirable within certain applications, the traditional static DC programming and reading methods as described above and detailed with respect to FIGS. 3A and 3B (and those methods discussed in Ser. No. 13/716,453 to Bertin) can represent, within certain applications, limitations with respect to the layout and design of a resistive change element array. The parasitic currents 360 inherent within static DC programming and READ operations as described with respect to FIG. 3B, for example, can, within certain applications, introduce certain design restrictions within a resistive change element array. For example, such a programming method can require, in certain applications, that the nominal SET and RESET resistance values used within a specific resistive change element be significantly far apart as compared with a resistive change element used within other architectures (100 and 200 in FIGS. 1 and 2, for example). Such a wide range in nominal resistance values could, for example, introduce physical dimension requirements within a nanotube fabric or a chalcogenide block used with the resistive change element making up the cells of the arrays.

Further, in another example, the length of the bit lines and the word lines used within the resistive change element array can be, in certain applications, limited due, in part, to the parasitic currents 360 detailed in FIG. 3B. The capacitance inherent in very long array lines can—again, in certain applications—allow these small currents to flow through unselected cells as the lines themselves charge up to their required voltages. While these parasitic current values might be small in magnitude as compared to a required programming current, for example, the prolonged current flow can, if not carefully considered within the array design, be enough to alter the resistance value stored in an unselected cell or inhibit or otherwise adversely affect a programming or READ operation. Such a limitation can, in certain applications, require bit lines and words lines to be limited to a certain length to reduce line capacitance.

In another example, the access and addressing method detailed in FIG. 3B can, in certain applications, require higher SET, RESET, and READ currents as compared to other resistive change element array architectures (100 and 200 in FIGS. 1 and 2, for example). Many of the parasitic currents 360 shown in FIG. 3B, for example, are driven by the same driver circuit, i.e.: the external circuit driving the programming voltage on WL1. Within an array architecture such as is shown in FIG. 2, for example, only the selected cell would be biased and enabled, and the entire supplied current would flow through the selected resistive change element. However, as is shown in FIG. 3B, using a traditional static DC programming or READ method within an array structure such as is shown in FIG. 3A (wherein the array cells contain no selection element) a supplied programming or READ current is driven through not only the selected cell, but also many of the unselected cells on the selected bit line and the selected word line. As such, the effective current through a selected cell can be, in these certain applications, significantly reduced as compared with other architectures. That is, for example, in order to provide a sufficient READ current as required by a certain application and resistive change element technology using the access and addressing method detailed in FIG. 3B, a significantly higher READ current (or voltage) would need to be supplied on WL1 to account for the parasitic currents inherent in the access and addressing method. Such increased power requirements can be, in certain applications, undesirable.

As described in detail above, while the 1-R resistive change element array architecture 301 of FIG. 3A (and similar variations) provides numerous benefits with respect to ease of design and fabrication as well as cost and scaling considerations, the static, DC programming methods as developed for other types of array architectures (such as, but not limited to array architectures 100 and 200 in FIGS. 1 and 2, respectively) can introduce undesirable limitations which can limit the effectiveness of such an array structure in certain applications. To this end, the present disclosure provides a dynamic access and addressing method that is well suited for use with a 1-R resistive change element array architecture wherein no selection devices (or other current limiting elements) are used within the array cells (as is detailed in FIG. 3A, for example). This dynamic access and addressing method can be used to perform SET, RESET, and READ operations within such architectures without incurring the limitations described above with respect to the method described in relation to FIG. 3B. This dynamic access and addressing method will be described in detail within the discussion of FIGS. 6, 7A, 7B, 8A, 8B, 9A, and 9B below.

Looking now to FIG. 4, an altered version of the 1-R array architecture detailed in FIG. 3A is illustrated in a simplified schematic diagram. This altered array architecture 400 is presented as a variation on the array architecture 301 shown in FIG. 3A and is well suited for use with the dynamic programming and dynamic reading methods of the present disclosure.

Array architecture 400 is nearly identical in structure array architecture 301 in FIG. 3A. Each of the 1-R array cells (CELL00-CELLxy) is made up of only a single resistive change element (SW00-SWxy), and no in situ selection devices or other current limiting devices are used within the array cells. Each of the cells (CELL00-CELLxy) is addressed and accessed responsive to only two lines: a word line (WL[0]-WL[y]) and a bit line (BL[0]-BL[x]). The one variation within array architecture 400 (as compared with array architecture 301 of FIG. 3) is the addition of reference resistive elements ($R_{REF0}$-$R_{REFy}$) and the reference bit line (BL_REF). These reference elements are used within at least one aspect of the dynamic READ method of the present disclosure, and their function will be explained in detail within the discussion of FIGS. 7A and 7B below.

FIG. 5 is a perspective drawing of a 3D resistive change element array 500. Resistive change element array 500 is comprised of 1-R resistive change cells arranged in three dimensions (along the x-, y-, and z-axes). A first layer of bit lines (542a, 544a, 546a, and 548a) are disposed along the y-axis, and a first layer of word lines (532a, 534a, 536a, and 538a) are disposed along the x-axis and above this first layer of bit lines. Between these first two layers of bit lines (542a, 544a, 546a, and 548a) and words lines (532a, 534a, 536a, and 538a), a first layer of resistive change elements 510 is disposed, one resistive change element at each word line and bit line crossing. The resistive change elements are each comprised of a resistive change material 516 (such as, but not limited to, a nanotube fabric layer or a block of phase change material) disposed between a first conductive element 512 and a second conductive element 514. It is desirable, in certain applications, to use these first and second conductive elements (512 and 514, respectively) to provide a conductive path between an array line (a word or bit line) and the actual resistive change material 516. However, these conductive elements (512 and 514) are not required in every application. For example, depending on the material used for the array lines, the particular material selected for the resistive change element 516, and the layout and fabrication methods being used, in certain applications it could be more favorable for the resistive change material block to connect directly to the array lines themselves. As such, the inclusion of first and second conductive elements (512 and 514, respectively) should not be seen as limiting with respect to the architecture of 1-R resistive change element arrays.

A second layer of bit lines (542b, 544b, 546b, and 548b) is disposed along the y-axis above the first layer of word lines. Between this second layer of bit lines (542b, 544b, 546b, and 548b) and the first layer of words lines (532a, 534a, 536a, and 538a), a second layer of resistive change elements 510 is disposed, one resistive change element at each word line and bit line crossing. A second layer of word lines (532b, 534b, 536b, and 538b) is disposed along the x-axis above the second layer of bits lines (542b, 544b, 546b, and 548b), and a third layer of resistive change elements 510 is disposed, one resistive change element at each word line and bit line crossing. In this way, an array of forty-eight 1-R resistive change element cells is arranged within essentially the same cross sectional area that would be used for an array of only sixteen array cells within a traditional 2D array structure.

A 3D array structure, as detailed in FIG. 5, is highly desirable in terms of scaling and array cell density. And the relatively simplicity of the 1-R cell architecture (as described in detail with respect to FIGS. 3A and 4) is well suited for such a 3D structure, and provides numerous manufacturing and functional benefits. Further, the dynamic access and addressing methods of the present disclosure are especially well suited to such a complex array structure. As will be discussed in detail below (with respect to FIGS. 6, 7A, 7B, 8A, 8B, 9A, and 9B), the dynamic programming and READ methods of the present disclosure eliminate many of the design restrictions inherent in the static DC methods (such as are described in relation to FIG. 3B above). As such, in certain applications, the methods of the present disclosure are well suited for use with complex array structure such as is depicted in FIG. 5.

Figure 6:
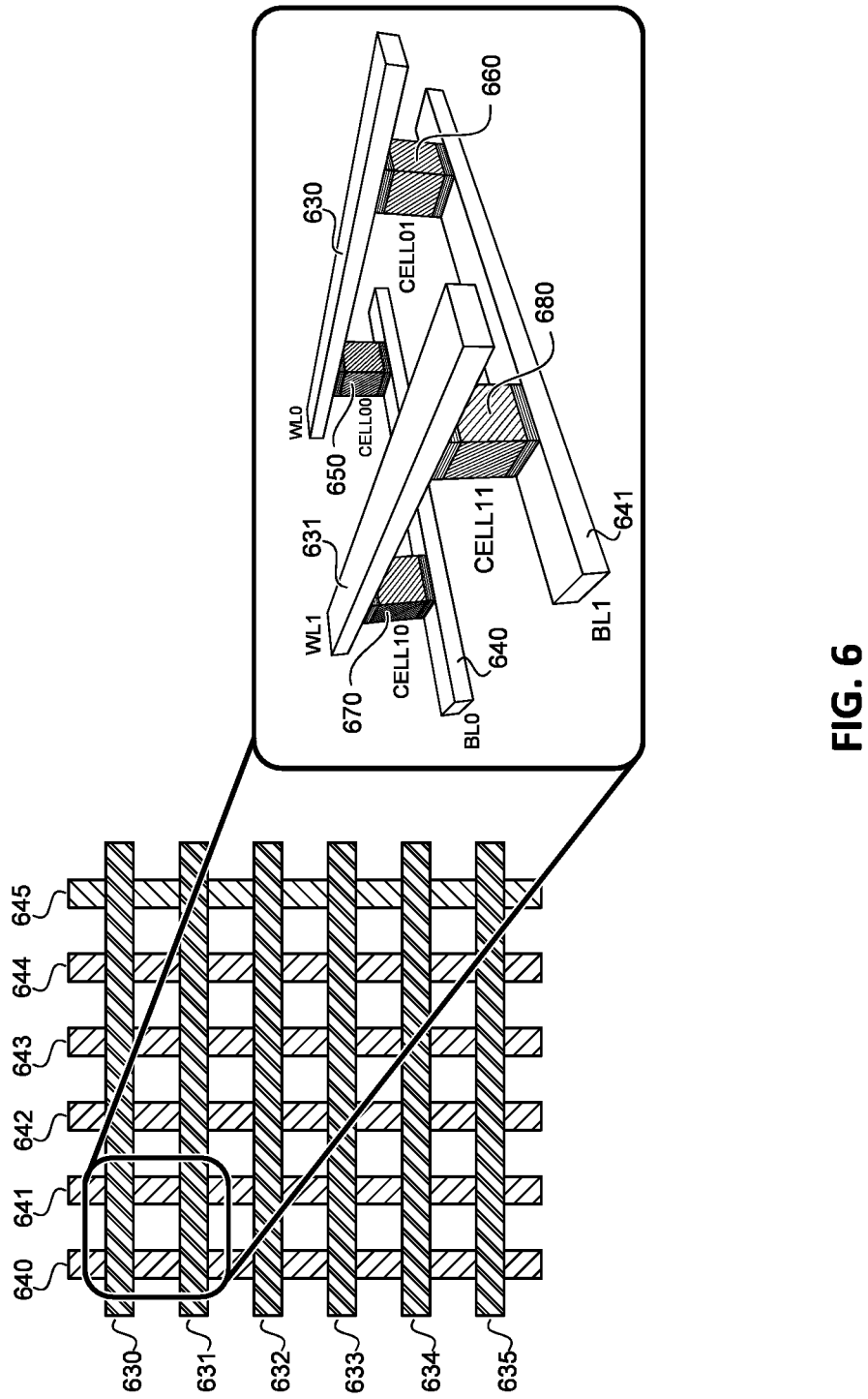
FIG. 6 is diagram illustrating four exemplary individual 1-R resistive change cells within a resistive change element array that will be referenced with respect to FIGS. 7B, 8B, and 9B.

Referring now to FIG. 6, four 1-R cells (650, 660, 670, and 680) of a resistive change element array are detailed and illustrated in a perspective drawing. These four resistive change element cells (650, 660, 670, and 680) will be used as a reference (within the discussion of FIGS. 7B, 8B, and 9B) to illustrate exemplary dynamic READ and dynamic programming operations according to the methods of the present disclosure.

The resistive change element array as depicted in FIG. 6 is an array of 1-R resistive change element cells that uses an array structure as detailed in FIG. 4. Word lines 630-635 are analogous to WL[0]-WL[y] in FIG. 4, and bit lines 640-644 are analogous to BL[0]-BL[y] in FIG. 4. As is depicted within the array structure 400 of FIG. 4, at each cross point intersection of these words lines (630-635) and bit lines (640-644) is a 1-R resistive change element cell (analogous to CELL00-CELLxy in FIG. 4), one terminal of the resistive change element electrically coupled to a word line and the other terminal electrically coupled to a bit line. Bit line 645 is analogous to BL_REF in FIG. 4, and at each cross point intersection of bit line 645 with a word line (630-635) there is a reference resistive element (analogous to $R_{REF0}$-$R_{REFy}$ in FIG. 4).

The four exemplary cells (650, 660, 670, and 680) shown in the zoomed in perspective drawing within FIG. 6 are shown to be responsive to WL0, WL1, BL0, and BL1 (630, 631, 640, and 641, respectively). As such, exemplary cell 650 has been labeled CELL00, being responsive to WL0 (630) and BL0 (630); exemplary cell 660 has been labeled CELL01, being responsive to WL0 (630) and BL1 (641); exemplary cell 670 has been labeled CELL10, being responsive to WL1 (631) and BL0 (640); and exemplary cell 680 has been labeled CELL11, being responsive to WL1 (631) and BL1 (641). These cells and their associated array lines will be referenced within the exemplary dynamic READ and dynamic programming operations detailed in FIGS. 7B, 8B, and 9B, respectively. Additionally, FIG. 7B will illustrate voltage and current waveforms as applied to reference element $R_{REF1}$. Reference element $R_{REF1}$, while not explicitly shown in FIG. 6 for the sake of clarity, is a resistive reference element situated at the cross point intersection of WL1 (word line 631) and reference bit line 645 and is analogous to $R_{REF1}$ in FIG. 4.

Figure 7A:
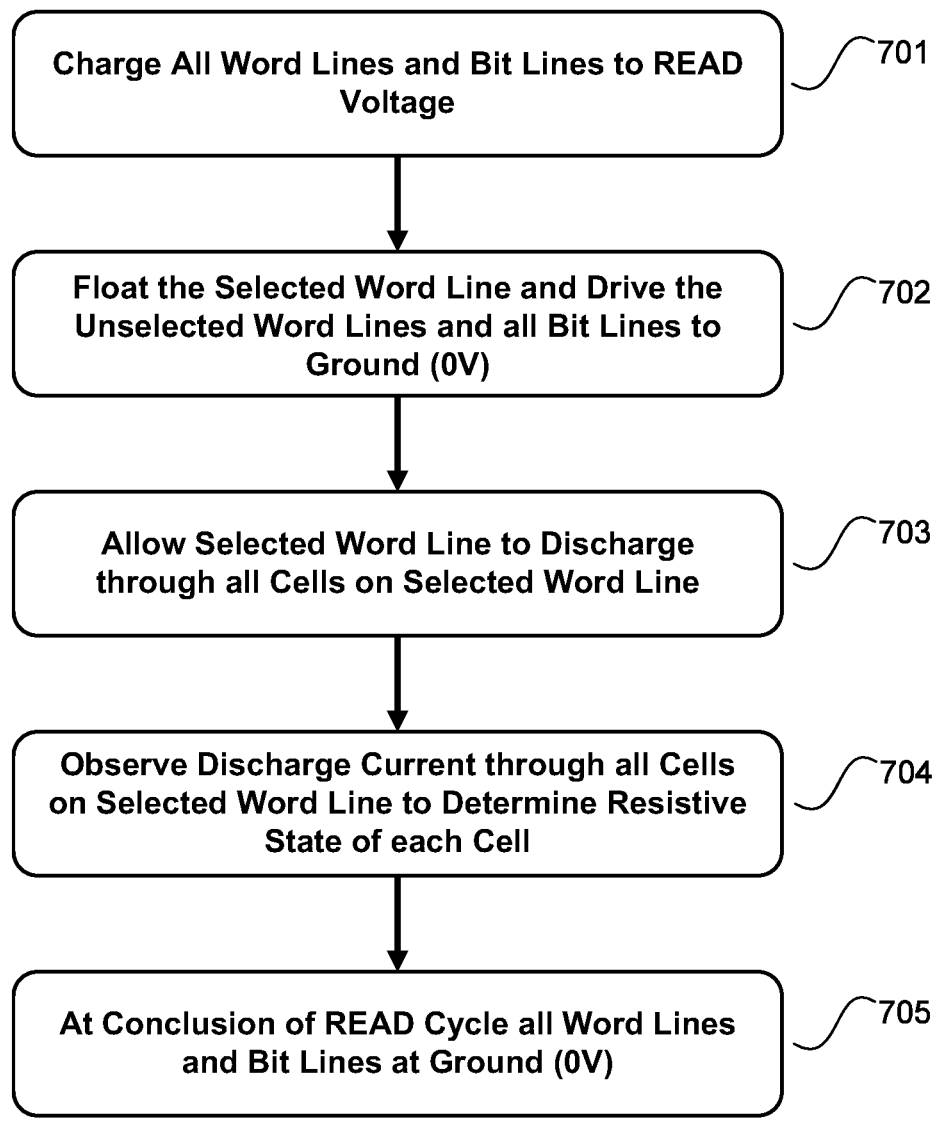
FIG. 7A is a flow chart detailing a method according to the present disclosure for performing a dynamic READ operation on all the bits associated with a selected word line within a resistive change element array.
Figure 7B:
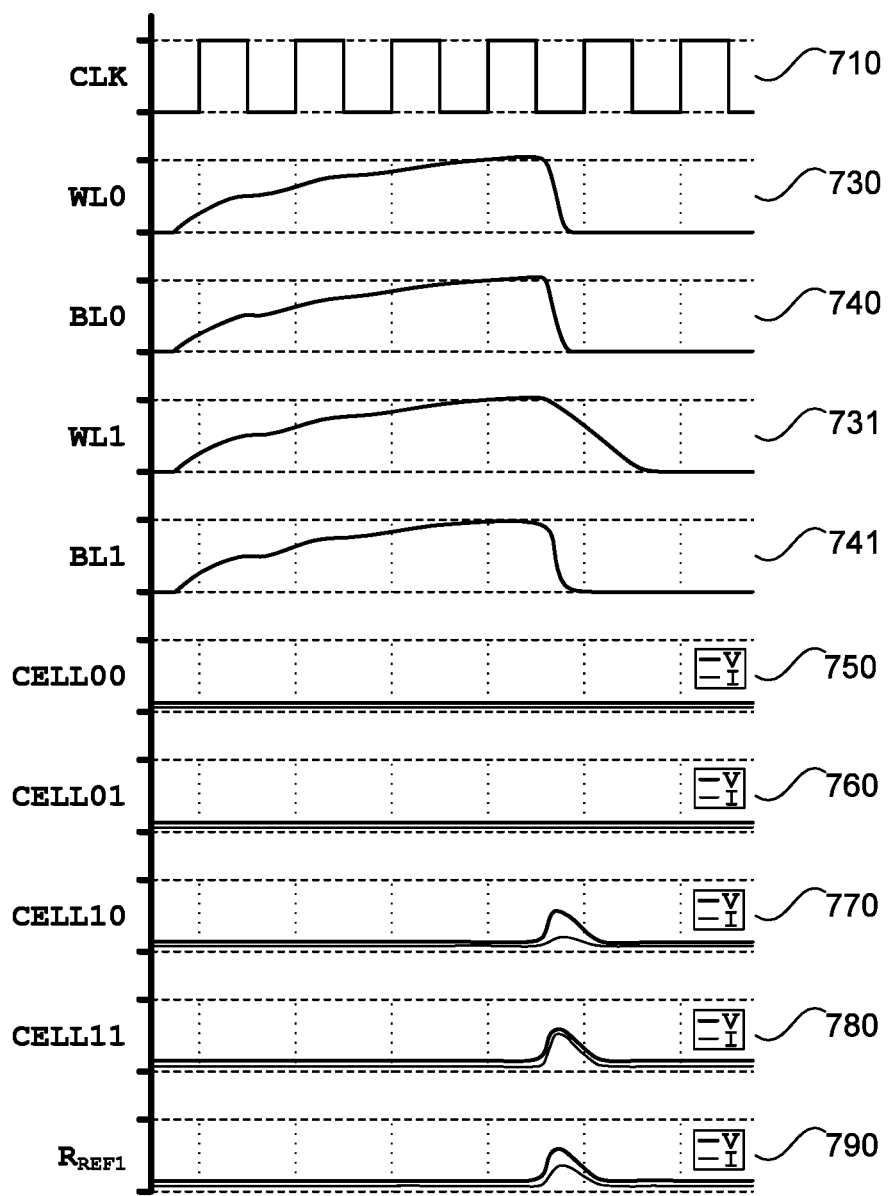
FIG. 7B is a series waveform diagrams (710-790) detailing the electrical stimuli provided to the resistive change cells of FIG. 6 during an exemplary dynamic READ operation performed according to the methods of the present disclosure as detailed in FIG. 7A.

Referring now to FIGS. 7A and 7B, a method according to the present disclosure for dynamic reading one or more cells within a resistive change element array is shown. FIG. 7A is a flow chart 700 detailing a dynamic READ operation according to the methods of the present disclosure. And, FIG. 7B is a series of waveform diagrams illustrating an exemplary dynamic READ operation as described in FIG. 7A and according to the methods of the present disclosure. The waveforms in FIG. 7B detail an exemplary dynamic READ operation of CELL10 (670) and CELL11 (680) within FIG. 6 (both cells read simultaneously) and are intended to serve as a non-limiting illustrative example of the dynamic READ method of the present disclosure (as detailed in FIG. 7A). As described in detail above, this dynamic READ operation is well suited for accessing and addressing elements within an array of 1-R resistive change element cells, such as are depicted in FIGS. 3A, 4, 5, and 6 as well as similar variations of those array structures.

In a first process step 701, all word lines and bit lines within the array are pre-charged to the required READ voltage simultaneously. In this way, no voltage drop (or current flow) is experienced by any of the cells within the array during the array line pre-charging (process step 701). That is, all cells within the array see essentially the same voltage on their associated word lines and their associated bit lines during the pre-charging process.

Looking now to FIG. 7B, this pre-charging process step (701 in FIG. 7A) is performed over the first four cycles of a clock signal represented by waveform 710. This clock signal waveform 710 has been included within the waveforms of FIG. 7B to represent the timing of applied signals and process steps with respect to a processor control element (such as, but not limited to, a microprocessor, microcontroller, FPGA, or CPLD) performing the dynamic READ methods of the present disclosure. Over these first four clock cycles, WL0 (associated with waveform 730), BL0 (associated with waveform 740), WL1 (associated with waveform 731), and BL1 (associated with waveform 741) charge up simultaneously and track essentially the same voltage levels until all four lines are at the required READ voltage (as determined by the needs of the resistive change elements used in a particular application). As such, the voltage and current across and through all four cells—CELL00 (associated with waveform 750), CELL01 (associated with waveform 760), CELL10 (associated with waveform 770), and CELL11 (associated with waveform 780)—is approximately zero for the duration of the pre-charging process step (701 in FIG. 7A).

In a next process step 702, the selected word line—that is the word line associated with the cell or cells within the resistive change element array to be READ—is floated, and the remaining word lines are driven down to ground (0V). All bit lines in the array are also pulled down to ground (0V). Then, in a next process step 703, the selected word line is allowed to discharge through the resistive change elements associated with it. In a next process step 704, as the selected word line is discharged (process step 703), the current flow through each cell is observed and analyzed, thereby determining the resistive state of the resistive change element within each cell. That is, a resistive change element configured in a relatively high resistive state will exhibit a relatively low current during this discharge process, and a resistive change element configured in a relatively low resistive state will exhibit a relatively high current.

Looking to FIG. 7B, this discharging process step (702 in FIG. 7A) is performed between the fourth and sixth clock cycles (again, looking to the reference clock waveform 710). As the exemplary dynamic READ operation detailed in FIG. 7B is intended to determine the resistive state of CELL10 and CELL11, WL0, BL0, and BL1 are pulled to ground (0V) and WL1 is floated. With WL0, BL0, and BL1 all pulled down to ground (0V) simultaneously, there is essentially no voltage drop across or resulting current through CELL00 and CELL01 (as is shown in waveforms 750 and 760). Both cells see approximately the same voltage on their associated word lines and bit lines throughout the READ operation. WL1, however, discharges through CELL10 and CELL11 to BL0 and BL1, respectively (both BL0 and BL1 at 0V), corresponding to process step 703 in FIG. 7A.

To better illustrate next process step 704, within the exemplary dynamic READ operation of FIG. 7B, CELL10 is imagined to be configured in a relatively high resistive state, and CELL11 is imagined to be configured in a relatively low resistive state. As WL1 discharges (process step 703 in FIG. 7A), a voltage drop is seen across both CELL10 (the voltage difference between WL1 and BL0) and CELL11 (the voltage difference between WL1 and BL1), as shown in waveforms 770 and 780, respectively. The resistive states of both these cells are READ simultaneously by observing the current through each cell during the discharge of WL1 (process step 704 in FIG. 7A). This observed or measured current is the "read current" for as array cell being read and is indicative of the resistive state of—and, by extension, the logic value stored within—the resistive change element with an array cell. Looking to waveform 770, the relatively low current observed would indicate that CELL10 is configured in a relatively high resistive state (or a RESET state). And looking to waveform 780, the relatively high current observed would indicate that CELL11 is configured in a relatively low resistive state (or a SET state).

Waveform 790 depicts the voltage across and current through a resistive reference element ($R_{REF1}$) situated at the cross point intersection of word line 631 and reference bit line 645 (in FIG. 6) and analogous to $R_{REF1}$ of FIG. 4. While not shown in FIG. 7B, the voltage waveform on reference bit line 645 of FIG. 6 can be thought to be identical to the waveform of BL0 as is consistent with the process steps of FIG. 7A. In the exemplary READ operation of FIG. 7B, $R_{REF1}$ is selected to have a resistance value between the nominal resistance value of a SET condition and the nominal resistance value of a RESET condition. During the exemplary dynamic READ operation (as described above), as WL1 discharges through CELL10 and CELL11 (process step 703 in FIG. 7A), it also discharges through $R_{REF1}$. And, as the electrical resistance of $R_{REF1}$ is selected to be fixed at a point between the nominal electrical resistance of a SET and a RESET condition for the particular resistive change element being used in the array, the current observed through $R_{REF1}$ (waveform 790) is observed to be somewhere between the current through CELL10 (waveform 770) and the current through CELL11 (waveform 780).

Within certain applications, the use of resistive reference elements in this way (as depicted in FIG. 4 and described with respect to waveform 790 in FIG. 7B) can provide a means for determining the resistive states stored within selected resistive change element cells during a READ operation. For example, using an array of current sense amplifiers external to the resistive change element array, the discharge current each of the bit lines (BL0 and BL1) could be compared to the discharge current on $R_{REF1}$ in real time during the discharge of WL1. Circuitry responsive to these current sense amplifiers could then latch in a first logic value if the current through a bit line is greater than the current through $R_{REF1}$ (as would be the case, in this exemplary dynamic READ operation, for CELL11) and latch in a second logic value if the current through a bit line is less than the current through $R_{REF1}$ (as would be the case, in this exemplary dynamic READ operation, for CELL10). These latched in logic values would be, of course, representative of the actual logic values stored within CELL10 and CELL11. In this way, very small differences in discharge current can be reliability and rapidly sensed without the need for additional circuit elements in situ with the array cells. Within certain applications, this precision can permit the use of significantly lower READ voltages and currents and significantly faster READ timing (as compared with conventional static DC access and addressing methods, such as are discussed, for example, with respect to FIGS. 1, 2, 3A, and 3B).

It should be noted that while the use of resistive reference elements (such as $R_{REF1}$) as described above can provide benefits in certain applications, the methods of the present disclosure are not limited in this regard. Indeed, the use of resistive reference elements is not required for the READ operation as detailed in FIG. 7A and discussed above. The use of resistive reference element $R_{REF1}$ is discussed with respect to process step 704 as a non-limiting illustrative example only. The methods of the present disclosure as discussed with reference to the dynamic READ operation detailed in FIG. 7A require only that the discharge current through each of the cells being READ be observed. Such an observation can performed however befits the needs of a specific application. For example, current sensing power supply circuits driving the voltage levels on the bit lines within the array (located outside the resistive change element array) could be used to sense read currents discharging through the selected cells and into the bit lines of the array. In another example, an external reference element could be used to provide similar functionality as the discussion of $R_{REF1}$ above.

It should also be noted that while the dynamic READ method described in FIG. 7A and used in the exemplary dynamic READ operation of FIG. 7B performs a READ operation on every array cell on a selected word line simultaneously, the methods of the present disclosure are not limited in this regard. Indeed, the dynamic READ method detailed in FIG. 7A can be used to address and READ a single cell or subset of cells on a particular word line. By limiting the current flow through the bit lines of unselected cells within process steps 702, 703, and 704 of FIG. 7A, the discharge current through unselected cells can be limited such as to not flow significantly through the unselected cells. In this way, an applied READ current on a word line will be directed mostly through the one or more cells selected for the READ operation. Limiting the current on these unselected bit lines can be performed, for example, by pulling the unselected bit lines down to ground (0V) through a pull down resistor, while pulling the selected bit line(s) directly to ground. This individual cell selection functionality (with respect to the dynamic access and addressing methods of the present disclosure) will be shown and described in more detail within the discussion of FIG. 9B, which shows a dynamic programming operation performed on a single cell within an exemplary resistive change element array.

In a final process step 705, the selected word line (WL1) has finished discharging, and all word lines and bits lines are at ground (0V), and the array is ready for the next access or addressing operation. It should be noted that while FIGS. 7A and 7B show READ currents flowing with a single polarity (from word line to bit line), the methods of the present disclosure are not limited in this regard. Indeed, the dynamic READ operation detailed in FIG. 7A could also be performed by grounding all the words lines and floating the selected bit line. This would result in READ currents flowing from bit line to word line (the opposite polarity as shown in the exemplary dynamic READ operation of FIG. 7B). That is to say, the dynamic READ method of the present disclosure is well suited for bipolar operation within a resistive change element array.

Figure 8A:
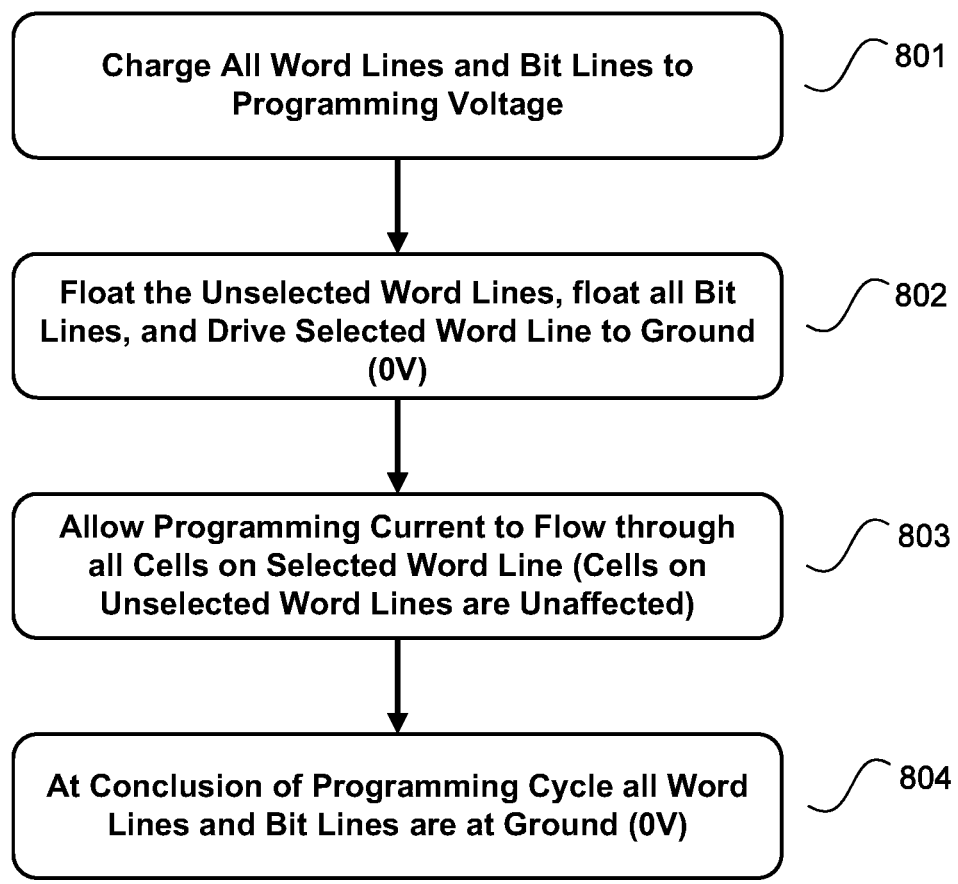
FIG. 8A is a flow chart detailing a method according to the present disclosure for performing a multi-cell dynamic programming operation on all the bits associated with a selected word line within a resistive change element array.
Figure 8B:
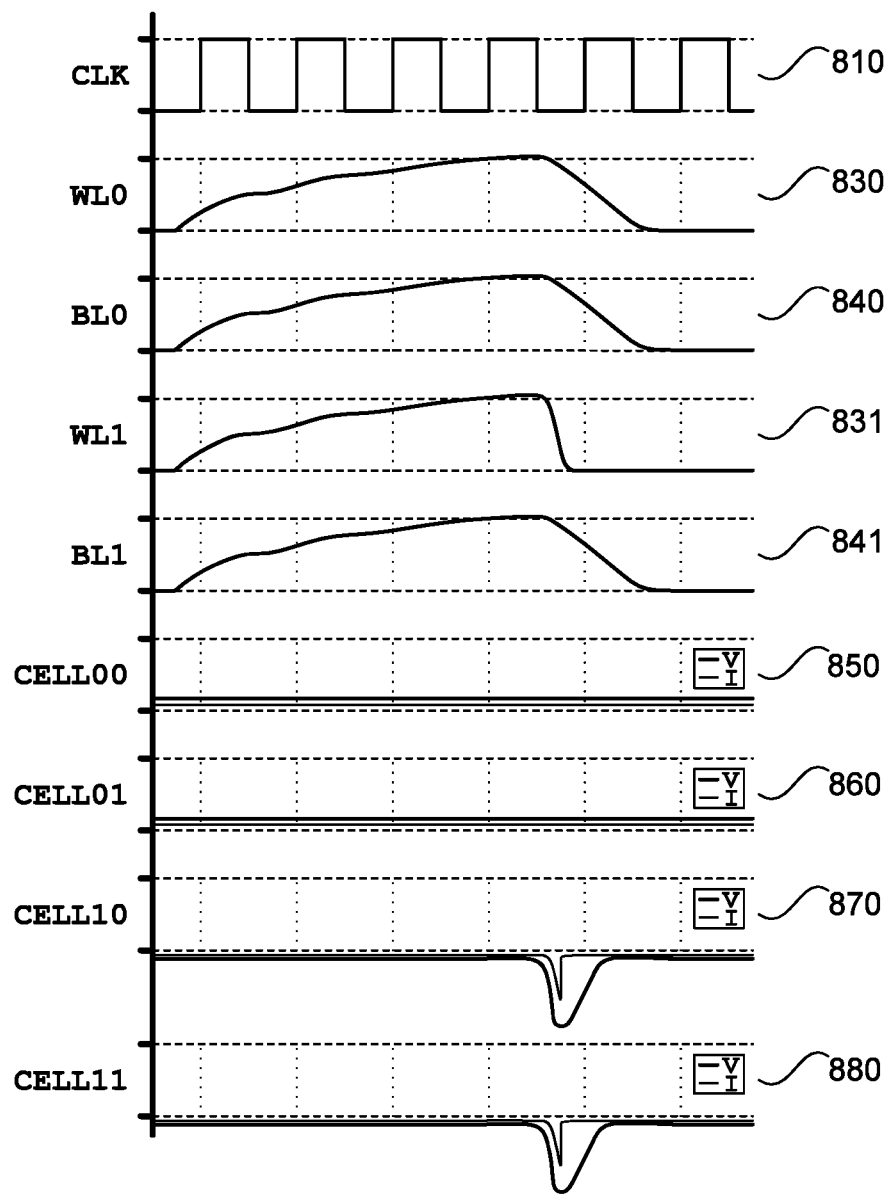
FIG. 8B is a series of waveform diagrams (810-880) detailing the electrical stimuli provided to the resistive change cells of FIG. 6 during an exemplary multi-cell dynamic programming operation performed according to the methods of the present disclosure as detailed in FIG. 8A.

Referring now to FIGS. 8A and 8B, a method according to the present disclosure for dynamic programming multiple cells within a resistive change element array is shown. FIG. 8A is a flow chart 800 detailing a dynamic programming operation on multiple cells within a resistive change element array according to the methods of the present disclosure. And FIG. 8B is a series of waveform diagrams illustrating an exemplary dynamic programming operation as described in FIG. 8A and according to the methods of the present disclosure. The waveforms in FIG. 8B detail an exemplary dynamic programming operation of CELL10 (670) and CELL11 (680) within FIG. 6 (both cells programmed simultaneously) and are intended to serve as a non-limiting illustrative example of the dynamic programming method of the present disclosure (as detailed in FIG. 8A). As described in detail above, this dynamic programming operation is well suited for accessing and addressing elements within an array of 1-R resistive change element cells, such as are depicted in FIGS. 3A, 4, 5, and 6 as well as similar variations of those array structures.

In a first process step 801, all word lines and bit lines within the array are pre-charged to the required programming voltage simultaneously. This programming voltage is selected (as determined by the needs of a particular application and the type of resistive change elements being used within the array) to provide a programming current sufficient to adjust the electrical resistance of the resistive change elements used within the array from a first resistive state to a second resistive state. That is, this selected programming voltage is sufficient to SET (adjust the resistive change elements from a relatively high resistive state to a relatively low resistive state) or RESET (adjust the resistive changes element from a relatively low resistive state to a relatively high resistive state) the selected array cells. As this programming voltage is applied to all of the bit lines and word lines of the array simultaneously, no voltage drop (or current flow) is experienced by any of the cells within the array during the array line pre-charging (process step 801). That is, all cells within the array see essentially the same voltage on their associated word lines and their associated bit lines during the pre-charging process.

Looking now to FIG. 8B, this pre-charging process step (801 in FIG. 8A) is performed over the first four cycles of a clock signal represented by waveform 810. As with waveform 710 in FIG. 7B, this clock signal waveform 810 has been included within the waveforms of FIG. 8B to represent the timing of applied signals and process steps with respect to a processor control element (such as, but not limited to, a microprocessor, microcontroller, FPGA, or CPLD) performing the dynamic programming methods of the present disclosure. Over these first four clock cycles, WL0 (associated with waveform 830), BL0 (associated with waveform 840), WL1 (associated with waveform 831), and BL1 (associated with waveform 841) charge up simultaneously and track essentially the same voltage levels until all four lines are at the required programming voltage (as determined by the needs of the resistive change elements used in a particular application). As such, the voltage and current across and through all four cells—CELL00 (associated with waveform 850), CELL01 (associated with waveform 860), CELL10 (associated with waveform 870), and CELL11 (associated with waveform 880)—is approximately zero for the duration of the pre-charging process step (801 in FIG. 8A).

In a next process step 802, the selected word line—that is the word line associated with the cells within the resistive change element array to be programmed—is driven to ground (0V), and the unselected word lines are allowed to float. All bit lines in the array are also allowed to float. Then, in a next process step 803, the floated bit lines associated with the selected cells within the array are allowed to discharge through the selected cells to the selected word line, which is the only word line at ground (0V), inducing a programming current through the selected cells. This programming current is sufficient to adjust the resistive change elements within the selected cells from an initial resistive state into a desired second resistive state (for example, into either a SET or RESET condition). No current flows through the unselected cells in the array as the bit lines and words lines associated with the unselected cells remain at approximately the same voltage during the programming operation.

Looking to FIG. 8B, this programming current process step (803 in FIG. 8A) is performed between the fourth and sixth clock cycles (again, looking to the reference clock waveform 810). As the exemplary dynamic programming operation detailed in FIG. 8B is intended to adjust the resistive states of the resistive change elements within CELL10 and CELL11, WL0, BL0, and BL1 are allowed to float and WL1 is driven to ground (0V). With WL0, BL0, and BL1 remaining at essentially the same voltage for the duration of the programming operation, there is essentially no voltage drop across or resulting current through CELL00 and CELL01 (as is shown in waveforms 850 and 860). Both cells see approximately the same voltage on their associated word lines and bit lines throughout the programming operation. With WL1 pulled to ground (0V), however, BL0 and BL1 are allowed to discharge through CELL10 and CELL11 to WL1 with a current sufficient adjust the resistive change elements within those cells from a first resistive state to a second desired resistive state (as is shown in waveforms 870 and 880), corresponding to process step 803 in FIG. 8A.

It should be noted that, as shown in waveforms 870 and 880, the programming voltage and current applied to the selected cells within the exemplary dynamic programming operation detailed in FIG. 8B are of an opposite polarity as compared to the READ voltages and currents applied in the exemplary dynamic READ operation (and as compared to the single cell programming voltage and current that will be discussed with respect to FIG. 9B below). However, although the programming currents associated with this method of the present disclosure are described (within FIGS. 8A and 8B) as flowing with a certain polarity (from bit line to word line), the methods of the present disclosure are not limited in this regard. Indeed, the dynamic programming operation detailed in FIG. 8A could also be performed by floating all the words lines within the array and grounding the selected bit line. This would result in programming currents flowing from word line to bit line (the opposite polarity as is shown in the exemplary dynamic programming operation of FIG. 8B). That is to say, the dynamic programming method of the present disclosure is well suited for bipolar operation within a resistive change element array.

In a final process step 804, all bit lines (BL0 and BL1) have finished discharging, and all word lines and bits lines are at ground (0V), and the array is ready for the next access or addressing operation. In this way, all of the cells associated with the selected world line (WL1) are adjusted into a SET or RESET state.

It should be noted that in certain applications of resistive change element arrays, one set of programming conditions are used to drive a resistive change element into a SET state and a second, different, set of programming conditions are used to drive a resistive change element into a RESET state. That is, for example, within such applications a first set of programming conditions (e.g., voltage, current, pulse width, polarity, etc.) will adjust a resistive change element that is initially in a SET state into a RESET state. However when this same set of programming conditions is applied to a resistive change element already in a RESET state, that element will simply remain in a RESET state in response to the applied programming conditions (that is, the resistive state of this element will remain essentially unchanged). As such, within these certain applications the multi-cell dynamic programming operation of the present disclosure (as described with respect to FIGS. 8A and 8B) can be used to ensure that an entire group of cells (on the cells on a selected word line, for example) are in the same state. For example, within such an application, a multi-cell dynamic programming operation according to the methods of the present disclosure could be used to perform a global RESET operation on a selected word line. Within such an operation, those cells on the selected word line initially in a SET state would be adjusted into a RESET state, and those cells on the selected word line initially in a RESET state would remain essentially unaffected by the programming operation and remain in a RESET state. In this way, at the conclusion of the programming operation, all cells on the selected word line will be in a RESET state.

Figure 9A:
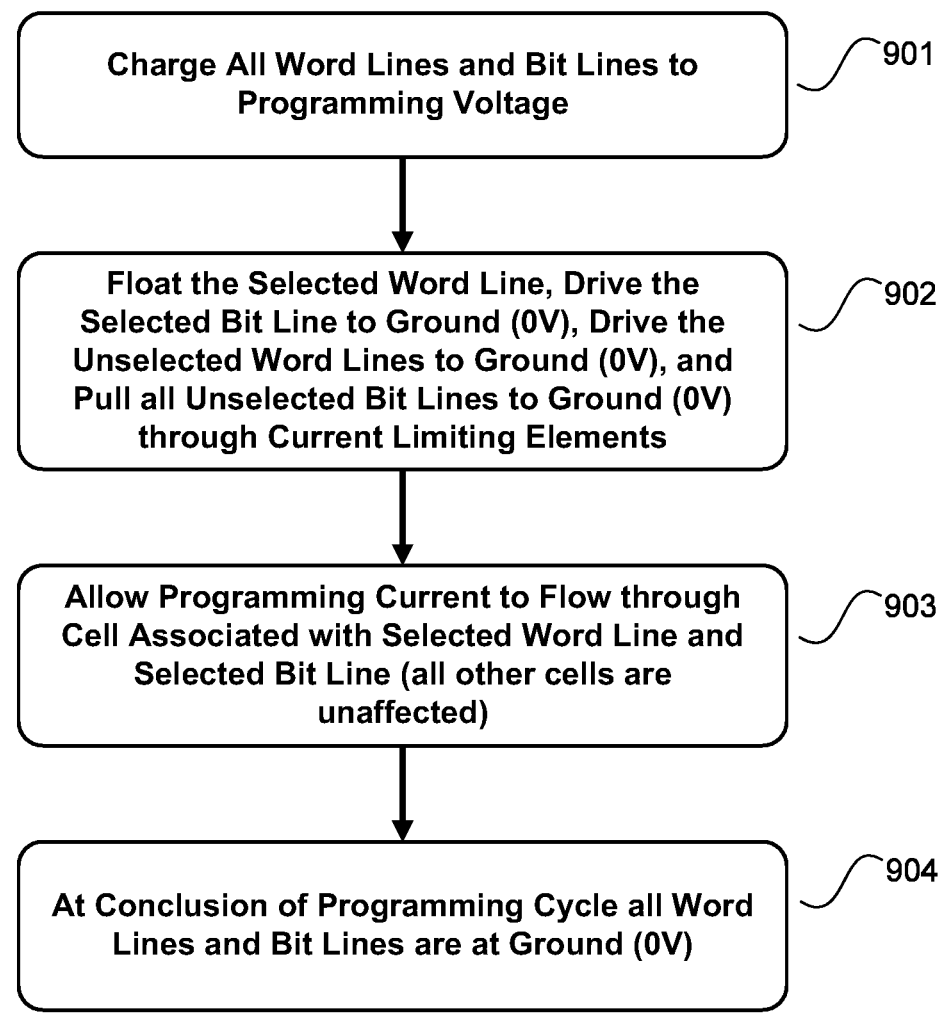
FIG. 9A is a flow chart detailing a method according to the present disclosure for performing a single cell dynamic programming operation on one cell within a resistive change element array.
Figure 9B:
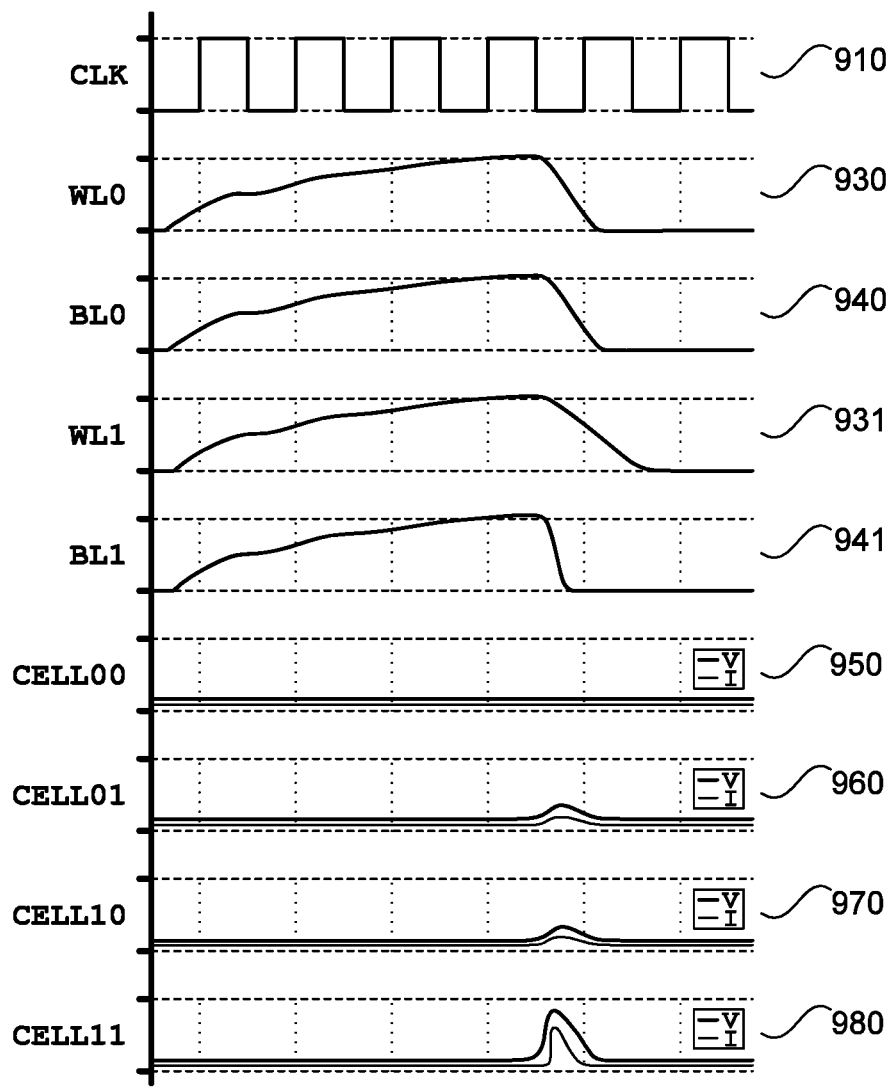
FIG. 9B is a series of waveform diagrams (910-980) detailing the electrical stimuli provided to the resistive change cells of FIG. 6 during an exemplary single cell dynamic programming operation performed according to the methods of the present disclosure as detailed in FIG. 9A.

Referring now to FIGS. 9A and 9B, a method according to the present disclosure for dynamic programming a single cell within a resistive change element array is shown. FIG. 9A is a flow chart 900 detailing a dynamic programming operation on a single cell within a resistive change element array according to the methods of the present disclosure. And FIG. 9B is a series of waveform diagrams illustrating an exemplary dynamic programming operation as described in FIG. 9A and according to the methods of the present disclosure. The waveforms in FIG. 9B detail an exemplary dynamic programming operation performed on CELL11 (680) within FIG. 6 (all other cells in the array remain unaffected by the programming operation) and are intended to serve as a non-limiting illustrative example of the dynamic programming method of the present disclosure (as detailed in FIG. 9A). As described in detail above, this dynamic programming operation is well suited for accessing and addressing elements within an array of 1-R resistive change element cells, such as are depicted in FIGS. 3A, 4, 5, and 6 as well as similar variations of those array structures.

In a first process step 901, all word lines and bit lines within the array are pre-charged to the required programming voltage simultaneously. This programming voltage is selected (as determined by the needs of a particular application and the type of resistive change elements being used within the array) to provide a programming current sufficient to adjust the electrical resistance of the resistive change elements used within the array from a first resistive state to a second resistive state. That is, this selected programming voltage is sufficient to SET (adjust the resistive change elements from a relatively high resistive state to a relatively low resistive state) or RESET (adjust the resistive changes element from a relatively low resistive state to a relatively high resistive state) the selected array cell. As this programming voltage is applied to all of the bit lines and word lines of the array simultaneously, essentially no voltage drop (or current flow) is experienced by any of the cells within the array during the array line pre-charging (process step 901). That is, all cells within the array see essentially the same voltage on their associated word lines and their associated bit lines during the pre-charging process.

Looking now to FIG. 9B, this pre-charging process step (901 in FIG. 9A) is performed over the first four cycles of a clock signal represented by waveform 910. As with waveform 710 in FIG. 7B and waveform 810 in FIG. 8B, this clock signal waveform 910 has been included within the waveforms of FIG. 9B to represent the timing of applied signals and process steps with respect to a processor control element (such as, but not limited to, a microprocessor, microcontroller, FPGA, or CPLD) performing the dynamic programming methods of the present disclosure. Over these first four clock cycles, WL0 (associated with waveform 930), BL0 (associated with waveform 940), WL1 (associated with waveform 931), and BL1 (associated with waveform 941) charge up simultaneously and track essentially the same voltage levels until all four lines are at the required programming voltage (as determined by the needs of the resistive change elements used in a particular application). As such, the voltage and current across and through all four cells CELL00 (associated with waveform 950), CELL01 (associated with waveform 960), CELL10 (associated with waveform 970), and CELL11 (associated with waveform 980)—is approximately zero for the duration of the pre-charging process step (901 in FIG. 9A).

In a next process step 902, the selected word line—that is, the word line associated with the cell within the resistive change element array to be programmed—is allowed to float, and the unselected word lines are pulled to ground (0V). The selected bit line—that is, the bit line associated with the cell within the resistive change element array to be programmed—is pulled down directly to ground (0V). The unselected bit lines in the array are also pulled to ground (0V), but they are pulled down in such a way as to limit the current flowing to ground through those bit lines. Limiting the current on these unselected bit lines can be performed, for example, by pulling the unselected bit lines down to ground (0V) through a pull down resistor (while pulling the selected bit line directly to ground). In another example, a programmable power supply driving the unselected bit lines could be set to limit the current through these unselected bit lines.

In a next process step 903, the floated word line is allowed to discharge through the selected cell to the selected bit line, inducing a programming current through the selected cell. This programming current is sufficient to adjust the resistive change element within the selected cells from an initial resistive state into a desired second resistive state (for example, into either a SET or RESET condition). A small current may flow through the unselected cells associated with the selected word line, however this current is sufficiently limited by circuit elements outside the resistive change element array such that it does not affect the unselected elements. In this way, an applied programming current on a selected word line will be directed almost entirely through the single cell selected for the programming operation.

Looking to FIG. 9B, this programming current process step (903 in FIG. 9A) is performed between the fourth and sixth clock cycles (again, looking to the reference clock waveform 910). As the exemplary programming operation detailed in FIG. 9B is intended to adjust the resistive state of the resistive change element within CELL11, WL0 and BL0 and pulled directly to ground, and BL1 is pulled to ground (0V) through a current limiting element (such as, but not limited to, a pull down resistor). WL1, the selected word line, is allowed to float. With WL0 and BL0 remaining at essentially the same voltage for the duration of the programming operation, there is essentially no voltage drop or current through CELL00 (as is shown in waveform 950). And with BL1 remaining at nearly the same voltage as WL1 and BL0 for the duration of the programming operation, there is only a very small voltage drop across—and, consequently, a very small resulting current through—CELL01, and CELL10 (as is shown in waveforms 960, and 970). These small resulting currents are kept sufficiently low by the external circuit elements driving the unselected bit lines such that the resistive change elements within these unselected array cells (CELL01 and CELL10) remain unaffected. With BL1 pulled directly to ground (0V), however, WL1 is allowed to discharge through CELL11 to BL1 with a current sufficient adjust the resistive change element within that cell from a first resistive state to a second desired resistive state (as is shown in waveform 980), corresponding to process step 903 in FIG. 9A.

It should be noted that, as described above with respect to the exemplary multi-cell programming method detailed in FIGS. 8A and 8B, the single cell programming operation of the present disclosure as detailed in FIGS. 9A and 9B is also well suited to bipolar operation. Indeed, the dynamic programming operation detailed in FIG. 9A could also be performed by grounding the selected word line within the array and floating the selected bit line. This would result in a programming current flowing from bit line to word line (the opposite polarity as is shown in the exemplary dynamic programming operation of FIG. 9B).

In a final process step 904, the selected word line (WL1) has finished discharging, and all word lines and bits lines are at ground (0V), and the array is ready for the next access and addressing operation. In this way, only the resistance of a single selected cell within the resistive change element array is adjusted during the dynamic programming operation.

Figure 10:
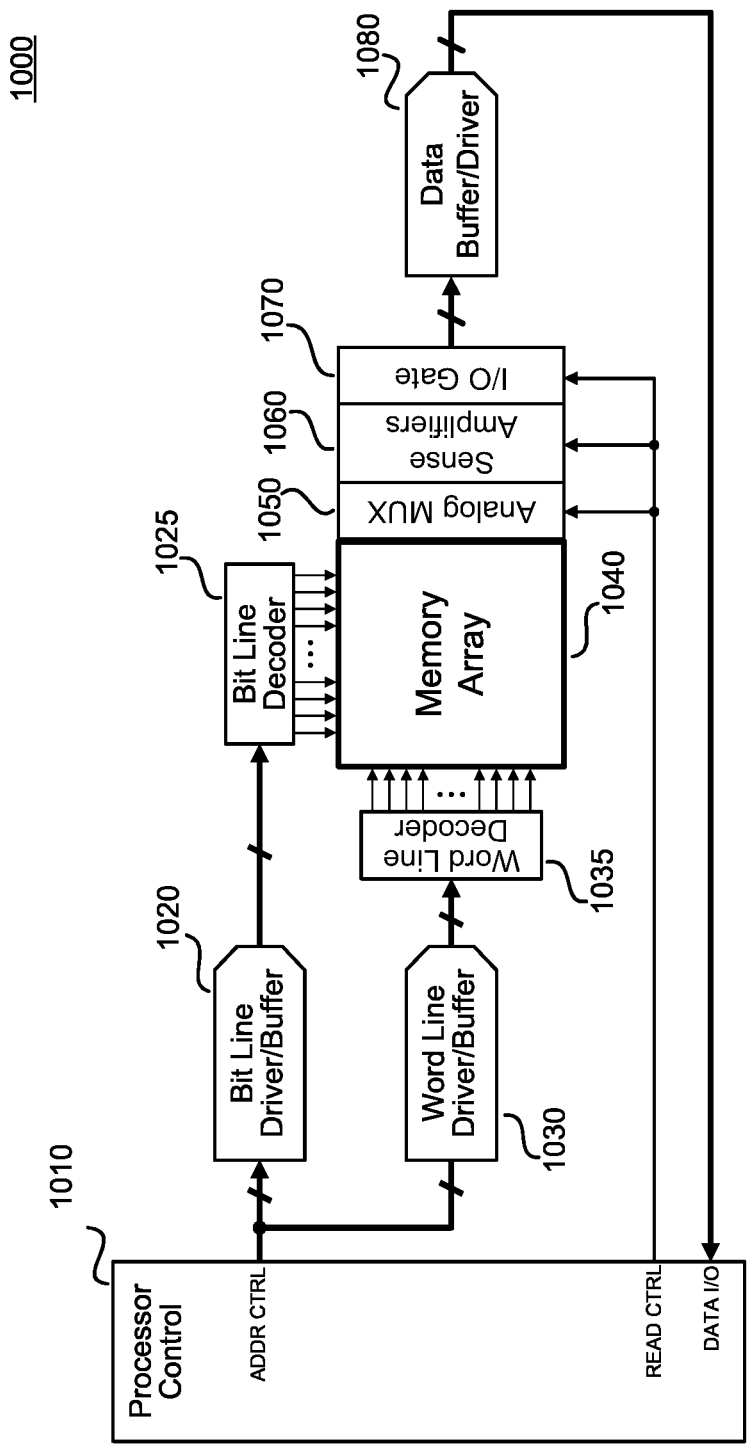
FIG. 10 is a simplified block diagram illustrating an access and addressing system capable of performing the dynamic programming and dynamic READ methods of the present disclosure on a resistive change element array.

Referring now to FIG. 10, a system level block diagram is shown illustrating a resistive change element array within an exemplary access and addressing system 1000 well suited for applying the dynamic READ and dynamic programming operations of the present disclosure.

At the core of the access and addressing system 1000 is a 1-R resistive change element array 1040 similar in architecture to the arrays shown in FIGS. 3A, 4, and 5. A processor control element 1010 provides an array of address control lines to a bit line driver/buffer circuit 1020 and to a word line driver/buffer circuit 1030. The bit line driver/buffer circuit 1020 then generates an array of bit lines through bit line decoder element 1025 and provides those bit lines to resistive change element array 1040. Similarly, the word line driver/buffer circuit 1030 generates an array of word lines through word line decoder element 1035 and provides those word lines to resistive change element array 1040. In this way, the dynamic programming methods of the present disclosure as described in detail within the discussion of FIGS. 8A, 8B, 9A and 9B above can be performed via electrical stimuli provided by processor control element 1010.

The 1-R resistive change element array 1040 is coupled to an array of sense amplifiers 1060 through an analog multiplexer element 1050. Responsive to control signals from the processor control element 1010, the analog multiplexer element 1050 interconnects the bit lines, words lines, and, in some cases, reference bit lines (as shown in FIG. 4, for example) to the array of sense amplifiers 1060. A system of I/O gates 1070 is responsive to the array of sense amplifiers 1060 and control signals from the processor control element 1010 and is used to temporally latch and store logic values read from the resistive change element array. Responsive to the I/O gate element 1070, a data buffer driver element 1080 provides the logic values read from the array back to the processor control element 1010. In this way, the dynamic READ method of the present disclosure as described in detail within the discussion of FIGS. 7A and 7B above can be performed via electrical stimuli provided by processor control element 1010.

The processor control element 1010 within the exemplary access and addressing system of FIG. 10 is used to represent a programming operation circuit (or the like) that can be used to apply the different voltages and other conditions to the arrays of bit lines and word lines within a resistive change element array as required by the methods of the present disclosure and discussed with respect to FIGS. 7A, 7B, 8A, 8B, 9A, and 9B above. The electrical stimuli required by the dynamic programming and dynamic READ operations of the present disclosure can be implemented through a variety of structures as best fits the needs of a specific application. For example, FPGAs, PLDs, microcontrollers, logic circuits, or a software program executing on a computer could all be used to execute the dynamic program-ming operations and dynamic READ operations as detailed in FIGS. 7A, 7B, 8A, 8B, 9A, and 9B as discussed above.

It should be noted that though the 1-R resistive change element array architectures used to illustrate the dynamic programming and dynamic READ methods of the present disclosure are presented using the exemplary schematic drawings in FIGS. 3A and 4, the methods of the present disclosure should not be limited to those specific electrical circuits depicted. Indeed, it will be clear to those skilled in the art that the electrical circuits depicted in FIGS. 3A and 4 can be altered in a plurality of ways and still realize an array architecture well suited to the dynamic programming and dynamic READ operations of the present disclosure. It is preferred, then, that the preceding description of resistive change element array architectures as they relate to the methods of the present disclosure be representative and inclusive of these variations and not otherwise limited to the specific illustrative parameters detailed.

Although the present invention has been described in relation to particular embodiments thereof, many other variations and modifications and other uses will become apparent to those skilled in the art. It is preferred, therefore, that the present invention not be limited by the specific disclosure herein.

What is claimed is:

1. A resistive change element array comprising:
    a plurality of word lines;
    a plurality of bit lines;
    a plurality of reference bit lines;
    a plurality of resistive change elements, wherein each resistive change element has a first terminal and a second terminal and wherein said first terminal of each resistive change element is in electrical communication with a word line and said second terminal of each resistive change element is in electrical communication with a bit line;
    a plurality of resistive reference elements, wherein each resistive reference element has a first terminal and a second terminal and wherein said first terminal of each resistive reference element is in electrical communication with a word line and said second terminal of each resistive reference element is in electrical communication with a reference bit line;
    a memory operation circuit operably coupled to said plurality of word lines, said plurality of bit lines, and said plurality of reference bit lines, said memory operation circuit including circuitry capable of providing a discharge current through at least one selected resistive change element and a discharge current through at least one selected resistive reference element;
    wherein each of said resistive change elements is adjustable between a first non-volatile resistive state and a second non-volatile resistive state responsive to electrical stimuli applied to said plurality of word lines and said plurality of bit lines;
    wherein each of said resistive change elements has a fixed electrical resistance value that is less than said first non-volatile resistive stat and greater than said second non-volatile resistive state.

2. The resistive change element array of claim 1 wherein said memory operation circuit includes circuitry capable of providing said discharge current through said at least one selected resistive change element and said discharge current through said at least one selected resistive reference element simultaneously within a single operation.

3. The resistive change element array of claim 1 wherein said memory operation circuit includes circuitry capable of providing said discharge current through said at least one selected resistive change element and said discharge current through said at least one selected resistive reference element sequentially within multiple operations.

4. The resistive change element array of claim 1 wherein said memory operation circuit includes circuitry capable of comparing said discharge current provided through said at least one selected resistive change element and said discharge current through at least one selected resistive reference element to determine the resistive state of said at least one resistive change element.

5. The resistive change element array of claim 4 wherein said memory operation circuit includes circuitry capable of determining the resistive state of at least two selected resistive change elements within a single operation.

6. The resistive change element array of claim 4 wherein said memory operation circuit includes circuitry capable of determining the resistive state of every resistive change element on a selected word line within a single operation.

7. The resistive change element array of claim 1 wherein said discharge currents do not significantly alter the state of said at least one resistive change element.

8. The resistive change element array of claim 1 wherein said first non-volatile resistive state corresponds to a first logic value and said second non-volatile resistive state corresponds to a second logic value.

9. The resistive change element array of claim 1 wherein said first non-volatile resistive state is at least ten times larger than said second non-volatile resistive state.

10. The resistive change element array of claim 1 wherein said first non-volatile resistive state is on the order of 10 M$\Omega$.

11. The resistive change element array of claim 1 wherein said second non-volatile resistive state is on the order of 100 k$\Omega$.

12. The resistive change element array of claim 1 wherein said resistive change elements are two-terminal nanotube switching elements.

13. The resistive change element array of claim 12 wherein said two-terminal nanotube switching elements comprise a nanotube fabric.

14. The resistive change element array of claim 1 wherein said resistive change elements are metal oxide memory elements.

15. The resistive change element array of claim 1 wherein said resistive change elements are phase change memory elements.

16. The resistive change element array of claim 1 wherein each of said resistive change elements is uniquely addressable by a word line and bit line combination.

17. The resistive change element array of claim 1 wherein said resistive change element array is a memory array.

* * * * *